US012587224B2

(12) United States Patent
Pehlke

(10) Patent No.: US 12,587,224 B2
(45) Date of Patent: Mar. 24, 2026

(54) RADIO FREQUENCY SIGNAL SPLITTING WITH DIFFERENTIAL FILTER AND LOW NOISE AMPLIFIERS

(71) Applicant: Skyworks Solutions, Inc., Irvine, CA (US)

(72) Inventor: David Richard Pehlke, Westlake Village, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 292 days.

(21) Appl. No.: 18/470,794

(22) Filed: Sep. 20, 2023

(65) Prior Publication Data

US 2024/0106476 A1      Mar. 28, 2024

Related U.S. Application Data

(60) Provisional application No. 63/377,080, filed on Sep. 26, 2022.

(51) Int. Cl.
H04B 1/16 (2006.01)
H03F 3/24 (2006.01)
H03H 7/42 (2006.01)

(52) U.S. Cl.
CPC ........... H04B 1/1638 (2013.01); H03F 3/245 (2013.01); H03H 7/425 (2013.01); H03F 2200/165 (2013.01); H03F 2200/294 (2013.01); H03F 2200/451 (2013.01)

(58) Field of Classification Search
CPC ........ H03F 2200/294; H03F 2200/451; H03F 3/245; H03F 3/195; H03F 1/223; H03F 1/565; H03F 3/72; H03F 3/193; H03F 2200/222; H03F 1/347; H03F 1/0266; H03F 2200/387; H03F 1/22; H03F 1/0277; H03F 1/32; H03F 1/3205
USPC ........................................................ 455/341
See application file for complete search history.

(56) References Cited

U.S. PATENT DOCUMENTS

| | | |
|---|---|---|
| 8,078,119 B2 | 12/2011 | Gorbachov |
| 9,450,541 B2 | 9/2016 | Beltran et al. |
| 9,853,610 B2 | 12/2017 | Beltran et al. |
| 10,581,466 B2 | 3/2020 | Pehlke |
| 10,587,291 B2 | 3/2020 | Pehlke |
| 11,038,543 B2 | 6/2021 | Chang et al. |
| 11,558,079 B2 | 1/2023 | Raghavan et al. |
| 11,742,890 B2 | 8/2023 | Raghavan et al. |
| 2007/0279099 A1* | 12/2007 | Goddard .............. H04B 1/1615 |
| | | 326/83 |

(Continued)

*Primary Examiner* — Ajibola A Akinyemi
(74) *Attorney, Agent, or Firm* — Knobbe, Martens, Olson & Bear, LLP

(57)      ABSTRACT

Apparatus and methods for radio frequency (RF) signal splitting are disclosed. In certain embodiments, a front-end system includes a filter that filters an RF receive signal to generate a differential filtered RF signal between a first output and a second output, a first low noise amplifier (LNA) that generates a first amplified RF signal by amplifying a first component of the differential filtered RF signal received from the first output, a second LNA that generates a second amplified RF signal by amplifying a second component of the differential filtered RF signal received from the second output, a first multi-throw switch that receives the first amplified RF signal, and a second multi-throw switch that receives the second amplified RF signal.

20 Claims, 13 Drawing Sheets

(56)          References Cited

U.S. PATENT DOCUMENTS

| | | | |
|---|---|---|---|
| 2010/0226292 A1 | 9/2010 | Gorbachov | |
| 2015/0249479 A1* | 9/2015 | Nobbe | H04B 15/005 |
| | | | 455/77 |
| 2016/0285490 A1* | 9/2016 | Hanaoka | H04B 1/16 |
| 2017/0194317 A1* | 7/2017 | Wallis | H10D 86/201 |
| 2018/0145648 A1* | 5/2018 | Ye | H03F 3/211 |
| 2019/0123699 A1 | 4/2019 | Andrys et al. | |
| 2022/0329269 A1 | 10/2022 | Pehlke | |

* cited by examiner mXn DL MIMO nXm UL MIMO

BASE STATION 41a

43a1
43b1
43c1
43m1

BASE STATION 41b

43a2
43b2
43c2
43m2

MOBILE DEVICE 42

44a
44b
44c
44n

190

RXA

RXB

157

157

159''

158

V_DD

155

153

156

154

151

ANT

195

157a

RXA

OPEN

OPEN

RXB

158a

159'''

157b

RXC

OPEN

OPEN

RXD

158b

157m

RXY

OPEN

OPEN

RXZ

158m

V_DD

155

153

156

154

151

ANT

RADIO FREQUENCY SIGNAL SPLITTING WITH DIFFERENTIAL FILTER AND LOW NOISE AMPLIFIERS

CROSS-REFERENCE TO RELATED APPLICATIONS

This application claims the benefit of priority under 35 U.S.C. § 119 of U.S. Provisional Patent Application No. 63/377,080, filed Sep. 26, 2022 and titled "RADIO FRE-QUENCY SIGNAL SPLITTING WITH DIFFERENTIAL FILTER AND LOW NOISE AMPLIFIERS," which is herein incorporated by reference in its entirety.

BACKGROUND

Field

Embodiments of the invention relate to electronic systems, and in particular, to radio frequency electronics.

Description of Related Technology

Radio frequency (RF) communication systems can be used for transmitting and/or receiving signals of a wide range of frequencies. For example, an RF communication system can be used to wirelessly communicate RF signals in a frequency range of about 30 kHz to 300 GHz, such as in the range of about 400 MHz to about 7.125 GHz for Frequency Range 1 (FR1) of the Fifth Generation (5G) communication standard or in the range of about 24.250 GHz to about 71.000 GHz for Frequency Range 2 (FR2) of the 5G communication standard.

Examples of RF communication systems include, but are not limited to, mobile phones, tablets, base stations, network access points, customer-premises equipment (CPE), laptops, and wearable electronics.

SUMMARY

In certain embodiments, the present disclosure relates to a mobile device. The mobile device includes an antenna configured to receive a radio frequency receive signal, a front-end system including a filter configured to filter the radio frequency receive signal to generate a differential filtered radio frequency signal between a first output and a second output, a first low noise amplifier configured to generate a first amplified radio frequency signal by amplifying a first component of the differential filtered radio frequency signal received from the first output, a second low noise amplifier configured to generate a second amplified radio frequency signal by amplifying a second component of the differential filtered radio frequency signal received from the second output, a first multi-throw switch configured to receive the first amplified radio frequency signal, and a second multi-throw switch configured to receive the second amplified radio frequency signal.

In some embodiments, the front-end system further includes a balun having a primary section connected between a first output of the first multi-throw switch and a first output of the second multi-throw switch, and a second-ary section connected to a radio frequency receive signal terminal. According to a number of embodiments, a second output of the first multi-throw switch is connected to a first split radio frequency signal terminal, and a second output of the second multi-throw switch is connected to a second split radio frequency signal terminal. In accordance with several embodiments, the first multi-throw switch and the second multi-throw switch are operable in a first mode in which the first amplified radio frequency signal and the second ampli-fied radio frequency signal are provided to the primary section of the balun, and a second mode in which the first amplified radio frequency signal is provided to the first split radio frequency signal terminal and the second amplified radio frequency signal is provided to the second split radio frequency signal terminal. According to various embodi-ments, a first power supply voltage is connected to a center tap of the primary section of the balun. In accordance with a number of embodiments, the front-end system further includes a first supply inductor connected between the second output of the first multi-throw switch and a second power supply voltage, and a second supply inductor con-nected between the second output of the second multi-throw switch and the second power supply voltage.

In several embodiments, the front-end system further includes a first matching inductor connected between an input of the first low noise amplifier and the first output of the filter, and a second matching inductor connected between an input of the second low noise amplifier and the second output of the filter.

In some embodiments, the filter is an acoustic wave filter having a single-ended input and a differential output.

In certain embodiments, the present disclosure relates to a method of radio frequency signal splitting in a mobile device. The method includes filtering a radio frequency receive signal using a filter to generate a differential filtered radio frequency signal between a first output and a second output of the filter, amplifying a first component of the differential filtered radio frequency signal received from the first output to generate a first amplified radio frequency signal, amplifying a second component of the differential filtered radio frequency signal received from the second output to generate a second amplified radio frequency sig-nal, receiving the first amplified radio frequency signal as an input to a first multi throw switch, and receiving the second amplified radio frequency signal as an input to a second multi-throw switch.

In some embodiments, the method further includes oper-ating the first multi-throw switch and the second multi-throw switch in a first mode in which the first amplified radio frequency signal is provided to a first end of a primary section of a balun and the second amplified radio frequency signal is provided to a second end of the primary section of the balun. According to a number of embodiments, the method further includes outputting a single-ended radio frequency receive signal from a secondary section of the balun. In accordance with various embodiments, the method further includes operating the first multi-throw switch and the second multi-throw switch in a second mode in which the first amplified radio frequency signal is provided to a first split radio frequency signal terminal and the second ampli-fied radio frequency signal is provided to a second split radio frequency signal terminal.

In several embodiments, the method further includes providing matching using a first matching inductor con-nected between an input of the first low noise amplifier and the first output of the filter and using a second matching inductor connected between an input of the second low noise amplifier and the second output of the filter.

In a number of embodiments, the filter is an acoustic wave filter having a single-ended input and a differential output.

In certain embodiments, the present disclosure relates to front-end system. The front-end system includes a filter configured to filter a radio frequency receive signal to generate a differential filtered radio frequency signal between a first output and a second output, a first low noise amplifier configured to generate a first amplified radio frequency signal by amplifying a first component of the differential filtered radio frequency signal received from the first output, a second low noise amplifier configured to generate a second amplified radio frequency signal by amplifying a second component of the differential filtered radio frequency signal received from the second output, a first multi-throw switch configured to receive the first amplified radio frequency signal, and a second multi-throw switch configured to receive the second amplified radio frequency signal.

In various embodiments, the front-end system further includes a balun having a primary section connected between a first output of the first multi-throw switch and a first output of the second multi-throw switch, and a secondary section connected to a radio frequency receive signal terminal. According to a number of embodiments, a second output of the first multi-throw switch is connected to a first split radio frequency signal terminal, and a second output of the second multi-throw switch is connected to a second split radio frequency signal terminal. In accordance with several embodiments, the first multi-throw switch and the second multi-throw switch are operable in a first mode in which the first amplified radio frequency signal and the second amplified radio frequency signal are provided to the primary section of the balun, and a second mode in which the first amplified radio frequency signal is provided to the first split radio frequency signal terminal and the second amplified radio frequency signal is provided to the second split radio frequency signal terminal. According to some embodiments, a first power supply voltage is connected to a center tap of the primary section of the balun. In accordance with a number of embodiments, the front-end system further includes a first supply inductor connected between the second output of the first multi-throw switch and a second power supply voltage, and a second supply inductor connected between the second output of the second multi-throw switch and the second power supply voltage.

In certain embodiments, the present disclosure relates to a mobile device. The mobile device includes an antenna configured to receive a radio frequency receive signal, and a front-end system including a filter configured to filter the radio frequency receive signal to generate a differential filtered radio frequency signal between a first output and a second output, a first low noise amplifier configured to generate a first amplified radio frequency signal by amplifying a first component of the differential filtered radio frequency signal received from the first output, a second low noise amplifier configured to generate a second amplified radio frequency signal by amplifying a second component of the differential filtered radio frequency signal received from the second output, a balun having a primary section connected between an output the first low noise amplifier and an output of the second low noise amplifier.

In various embodiments, the filter is an acoustic wave filter having a single-ended input and a differential output.

In some embodiments, the front-end system further includes a first multi-throw switch and a second multi-throw switch, the balun further including a first secondary section connected between an input to the first multi-throw switch and an input to the second multi-throw switch. According to a number of embodiments, the first multi-throw switch further includes a first output connected to a first split radio frequency signal terminal and a second output connected to a ground voltage, and the second multi-throw switch further includes a first output connected to a second split radio frequency signal terminal and a second output connected to the ground voltage. In accordance with several embodiments, the first multi-throw switch and the second multi-throw switch are operable in a first mode in which the first amplified receive signal is provided to the first split radio frequency signal terminal and the second amplified receive signal is provided to the second split radio frequency signal terminal. According to various embodiments, the first multi-throw switch and the second multi-throw switch are operable in a second mode in which the first amplified receive signal is provided to the first split radio frequency signal terminal and the input of the second multi-throw switch is connected to the second output of the second multi-throw switch.

In several embodiments, the front-end system further includes a third multi-throw switch and a fourth multi-throw switch, the balun further including a second secondary section connected between an input to the third multi-throw switch and an input to the fourth multi-throw switch. According to a number of embodiments, the front-end system further includes a fifth multi-throw switch and a sixth multi-throw switch, the balun further including a third secondary section connected between an input to the fifth multi-throw switch and an input to the sixth multi-throw switch. In accordance with various embodiments, the first multi-throw switch, the second multi-throw switch, the third multi-throw switch, and the fourth multi-throw switch are configured for equal power splitting. According to some embodiments, the first multi-throw switch, the second multi-throw switch, the third multi-throw switch, and the fourth multi-throw switch are configured for unequal power splitting.

In certain embodiments, the present disclosure relates to a method of radio frequency signal splitting in a mobile device. The method includes filtering a radio frequency receive signal using a filter to generate a differential filtered radio frequency signal between a first output and a second output of the filter, amplifying a first component of the differential filtered radio frequency signal received from the first output to generate a first amplified radio frequency signal, amplifying a second component of the differential filtered radio frequency signal received from the second output to generate a second amplified radio frequency signal, and providing the first amplified receive signal and the second amplified receive signal to opposite ends of a primary section of a balun.

In some embodiments, the method further includes outputting the first amplified receive signal and the second amplified receive signal from a first secondary section of the balun that is connected between an input to a first multi-throw switch and an input to a second multi-throw switch. According to a number of embodiments, the method further includes operating the first multi-throw switch and the second multi-throw switch in a first mode in which the first amplified receive signal is provided to a first split radio frequency signal terminal and the second amplified receive signal is provided to a second split radio frequency signal terminal. In accordance with several embodiments, the method further includes operating the first multi-throw switch and the second multi-throw switch in a second mode in which the first amplified receive signal is provided to the first split radio frequency signal terminal and the input of the second multi-throw switch is grounded. According to several embodiment, the method further includes operating the first multi-throw switch and the second multi-throw switch in a third mode in which the second amplified receive signal is provided to the second split radio frequency signal terminal and the input of the first multi-throw switch is grounded.

In various embodiments, the method further includes outputting the first amplified receive signal and the second amplified receive signal from a second secondary section of the balun that is connected between an input to a third multi-throw switch and an input to a fourth multi-throw switch.

In certain embodiments, the present disclosure relates to a front-end system. The front-end system includes a filter configured to filter a radio frequency receive signal to generate a differential filtered radio frequency signal between a first output and a second output, a first low noise amplifier configured to generate a first amplified radio frequency signal by amplifying a first component of the differential filtered radio frequency signal received from the first output, a second low noise amplifier configured to generate a second amplified radio frequency signal by amplifying a second component of the differential filtered radio frequency signal received from the second output, and a balun having a primary section connected between an output the first low noise amplifier and an output of the second low noise amplifier.

In some embodiments, the front-end system further includes a first multi-throw switch configured to receive the first amplified radio frequency signal and a second multi-throw switch configured to receive the second amplified radio frequency signal, the balun further including a first secondary section connected between an input to the first multi-throw switch and an input to the second multi-throw switch. According to a number of embodiments, the first multi-throw switch further includes a first output connected to a first split radio frequency signal terminal and a second output connected to a ground voltage, and the second multi-throw switch further includes a first output connected to a second split radio frequency signal terminal and a second output connected to the ground voltage. In accordance with several embodiments, the front-end system further includes a third multi-throw switch and a fourth multi-throw switch, the balun further including a second secondary section connected between an input to the third multi-throw switch and an input to the fourth multi-throw switch.

DETAILED DESCRIPTION OF EMBODIMENTS

Figure 1:
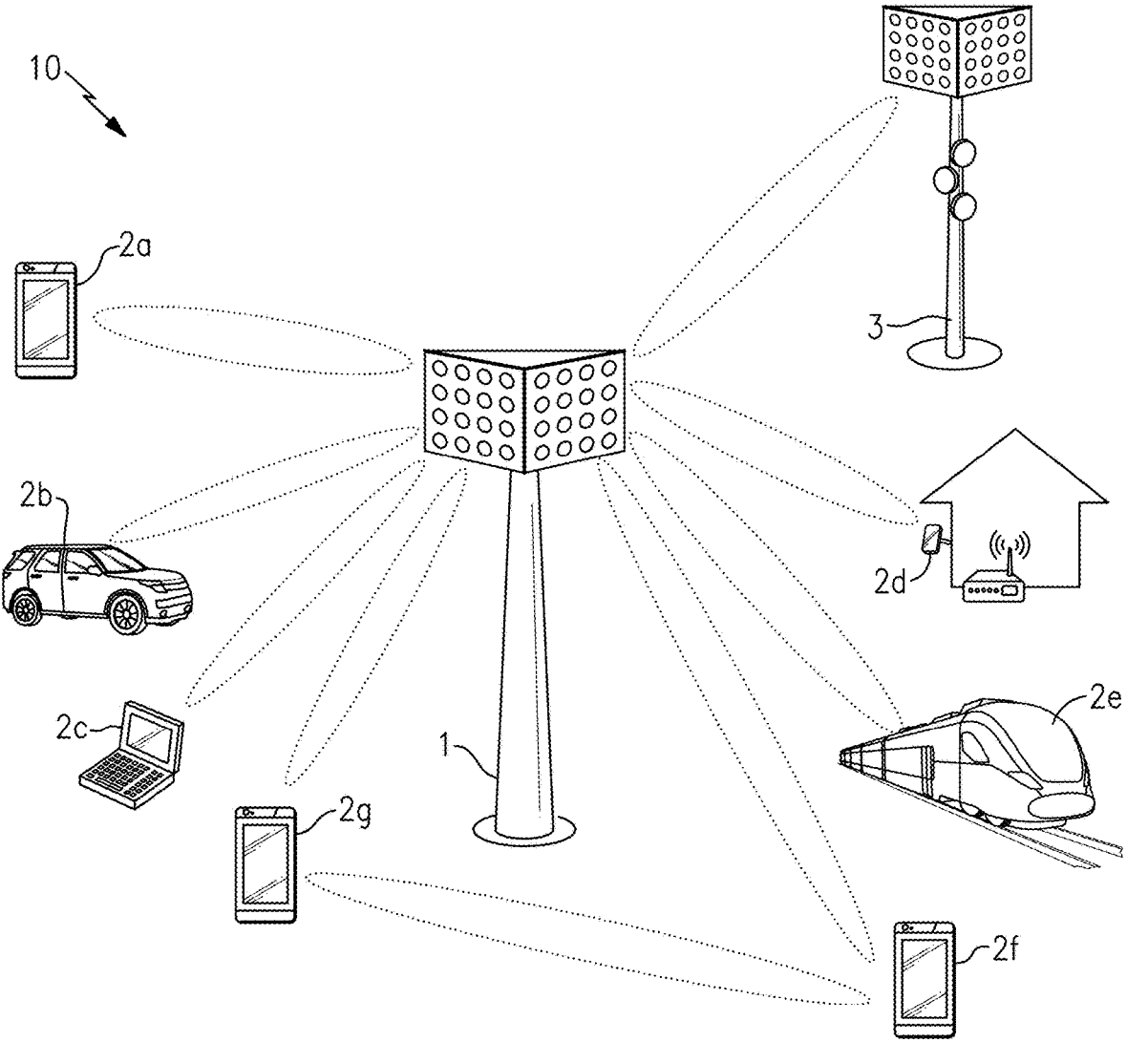
FIG. 1 is a schematic diagram of one example of a communication network.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The International Telecommunication Union (ITU) is a specialized agency of the United Nations (UN) responsible for global issues concerning information and communication technologies, including the shared global use of radio spectrum.

The 3rd Generation Partnership Project (3GPP) is a collaboration between groups of telecommunications standard bodies across the world, such as the Association of Radio Industries and Businesses (ARIB), the Telecommunications Technology Committee (TTC), the China Communications Standards Association (CCSA), the Alliance for Telecommunications Industry Solutions (ATIS), the Telecommunications Technology Association (TTA), the European Telecommunications Standards Institute (ETSI), and the Telecommunications Standards Development Society, India (TSDSI).

Working within the scope of the ITU, 3GPP develops and maintains technical specifications for a variety of mobile communication technologies, including, for example, second generation (2G) technology (for instance, Global System for Mobile Communications (GSM) and Enhanced Data Rates for GSM Evolution (EDGE)), third generation (3G) technology (for instance, Universal Mobile Telecommunications System (UMTS) and High Speed Packet Access (HSPA)), and fourth generation (4G) technology (for instance, Long Term Evolution (LTE) and LTE-Advanced).

The technical specifications controlled by 3GPP can be expanded and revised by specification releases, which can span multiple years and specify a breadth of new features and evolutions.

In one example, 3GPP introduced carrier aggregation (CA) for LTE in Release 10. Although initially introduced with two downlink carriers, 3GPP expanded carrier aggregation in Release 14 to include up to five downlink carriers and up to three uplink carriers. Other examples of new features and evolutions provided by 3GPP releases include, but are not limited to, License Assisted Access (LAA), enhanced LAA (eLAA), Narrowband Internet of things (NB-IOT), Vehicle-to-Everything (V2X), and High Power User Equipment (HPUE).

3GPP introduced Phase 1 of fifth generation (5G) technology in Release 15, and introduced Phase 2 of 5G technology in Release 16. Subsequent 3GPP releases will further evolve and expand 5G technology. 5G technology is also referred to herein as 5G New Radio (NR).

5G NR supports or plans to support a variety of features, such as communications over millimeter wave spectrum, beamforming capability, high spectral efficiency waveforms, low latency communications, multiple radio numerology, and/or non-orthogonal multiple access (NOMA). Although such RF functionalities offer flexibility to networks and enhance user data rates, supporting such features can pose a number of technical challenges.

The teachings herein are applicable to a wide variety of communication systems, including, but not limited to, communication systems using advanced cellular technologies, such as LTE-Advanced, LTE-Advanced Pro, and/or 5G NR.

FIG. 1 is a schematic diagram of one example of a communication network 10. The communication network 10 includes a macro cell base station 1, a small cell base station 3, and various examples of user equipment (UE), including a first mobile device 2a, a wireless-connected car 2b, a laptop 2c, a stationary wireless device 2d, a wireless-connected train 2e, a second mobile device 2f, and a third mobile device 2g.

Although specific examples of base stations and user equipment are illustrated in FIG. 1, a communication network can include base stations and user equipment of a wide variety of types and/or numbers.

For instance, in the example shown, the communication network 10 includes the macro cell base station 1 and the small cell base station 3. The small cell base station 3 can operate with relatively lower power, shorter range, and/or with fewer concurrent users relative to the macro cell base station 1. The small cell base station 3 can also be referred to as a femtocell, a picocell, or a microcell. Although the communication network 10 is illustrated as including two base stations, the communication network 10 can be implemented to include more or fewer base stations and/or base stations of other types.

Although various examples of user equipment are shown, the teachings herein are applicable to a wide variety of user equipment, including, but not limited to, mobile phones, tablets, laptops, IoT devices, wearable electronics, customer premises equipment (CPE), wireless-connected vehicles, wireless relays, and/or a wide variety of other communication devices. Furthermore, user equipment includes not only currently available communication devices that operate in a cellular network, but also subsequently developed communication devices that will be readily implementable with the inventive systems, processes, methods, and devices as described and claimed herein.

The illustrated communication network 10 of FIG. 1 supports communications using a variety of cellular technologies, including, for example, 4G LTE and 5G NR. In certain implementations, the communication network 10 is further adapted to provide a wireless local area network (WLAN), such as WiFi. Although various examples of communication technologies have been provided, the communication network 10 can be adapted to support a wide variety of communication technologies.

Various communication links of the communication network 10 have been depicted in FIG. 1. The communication links can be duplexed in a wide variety of ways, including, for example, using frequency-division duplexing (FDD) and/or time-division duplexing (TDD). FDD is a type of radio frequency communications that uses different frequencies for transmitting and receiving signals. FDD can provide a number of advantages, such as high data rates and low latency. In contrast, TDD is a type of radio frequency communications that uses about the same frequency for transmitting and receiving signals, and in which transmit and receive communications are switched in time. TDD can provide a number of advantages, such as efficient use of spectrum and variable allocation of throughput between transmit and receive directions.

In certain implementations, user equipment can communicate with a base station using one or more of 4G LTE, 5G NR, and WiFi technologies. In certain implementations, enhanced license assisted access (eLAA) is used to aggregate one or more licensed frequency carriers (for instance, licensed 4G LTE and/or 5G NR frequencies), with one or more unlicensed carriers (for instance, unlicensed WiFi frequencies).

As shown in FIG. 1, the communication links include not only communication links between UE and base stations, but also UE to UE communications and base station to base station communications. For example, the communication network 10 can be implemented to support self-fronthaul and/or self-backhaul.

The communication links can operate over a wide variety of frequencies. In certain implementations, communications are supported using 5G NR technology over one or more frequency bands that are less than 6 Gigahertz (GHz) and/or over one or more frequency bands that are greater than 6 GHz. For example, the communication links can serve Frequency Range 1 (FR1), Frequency Range 2 (FR2), or a combination thereof. In one embodiment, one or more of the mobile devices support a HPUE power class specification.

In certain implementations, a base station and/or user equipment communicates using beamforming. For example, beamforming can be used to focus signal strength to overcome path losses, such as high loss associated with communicating over high signal frequencies. In certain embodiments, user equipment, such as one or more mobile phones, communicate using beamforming on millimeter wave frequency bands in the range of 30 GHz to 300 GHz and/or upper centimeter wave frequencies in the range of 6 GHz to 30 GHz, or more particularly, 24 GHz to 30 GHz. Cellular user equipment can communicate using beamforming and/or other techniques over a wide range of frequencies, including, for example, FR2-1 (24 GHz to 52 GHz), FR2-2 (52 GHz to 71 GHz), and/or FR1 (400 MHz to 7125 MHz).

Different users of the communication network 10 can share available network resources, such as available frequency spectrum, in a wide variety of ways.

In one example, frequency division multiple access (FDMA) is used to divide a frequency band into multiple frequency carriers. Additionally, one or more carriers are allocated to a particular user. Examples of FDMA include, but are not limited to, single carrier FDMA (SC-FDMA) and orthogonal FDMA (OFDMA). OFDMA is a multicarrier technology that subdivides the available bandwidth into multiple mutually orthogonal narrowband subcarriers, which can be separately assigned to different users.

Other examples of shared access include, but are not limited to, time division multiple access (TDMA) in which a user is allocated particular time slots for using a frequency resource, code division multiple access (CDMA) in which a frequency resource is shared amongst different users by assigning each user a unique code, space-divisional multiple access (SDMA) in which beamforming is used to provide shared access by spatial division, and non-orthogonal multiple access (NOMA) in which the power domain is used for multiple access. For example, NOMA can be used to serve multiple users at the same frequency, time, and/or code, but with different power levels.

Enhanced mobile broadband (eMBB) refers to technology for growing system capacity of LTE networks. For example, eMBB can refer to communications with a peak data rate of at least 10 Gbps and a minimum of 100 Mbps for each user. Ultra-reliable low latency communications (uRLLC) refers to technology for communication with very low latency, for instance, less than 2 milliseconds. uRLLC can be used for mission-critical communications such as for autonomous driving and/or remote surgery applications. Massive machine-type communications (mMTC) refers to low cost and low data rate communications associated with wireless connections to everyday objects, such as those associated with Internet of Things (IoT) applications.

The communication network 10 of FIG. 1 can be used to support a wide variety of advanced communication features, including, but not limited to, eMBB, uRLLC, and/or mMTC.

Figure 2A:
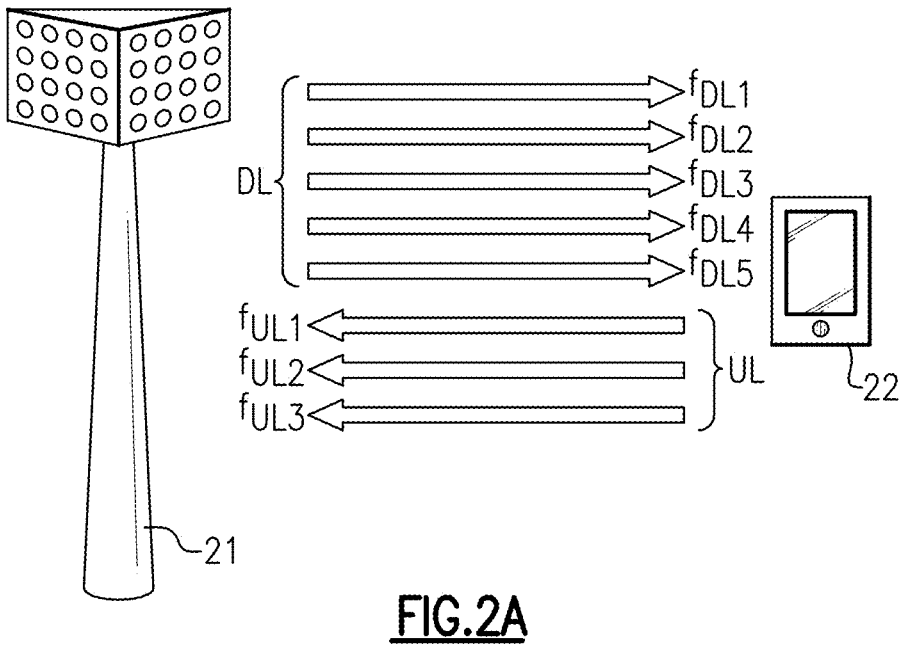
FIG. 2A is a schematic diagram of one example of a communication link using carrier aggregation.

FIG. 2A is a schematic diagram of one example of a communication link using carrier aggregation. Carrier aggregation can be used to widen bandwidth of the communication link by supporting communications over multiple frequency carriers, thereby increasing user data rates and enhancing network capacity by utilizing fragmented spectrum allocations.

In the illustrated example, the communication link is provided between a base station 21 and a mobile device 22. As shown in FIG. 2A, the communications link includes a downlink channel used for RF communications from the base station 21 to the mobile device 22, and an uplink channel used for RF communications from the mobile device 22 to the base station 21.

Although FIG. 2A illustrates carrier aggregation in the context of FDD communications, carrier aggregation can also be used for TDD communications.

In certain implementations, a communication link can provide asymmetrical data rates for a downlink channel and an uplink channel. For example, a communication link can be used to support a relatively high downlink data rate to enable high speed streaming of multimedia content to a mobile device, while providing a relatively slower data rate for uploading data from the mobile device to the cloud.

In the illustrated example, the base station 21 and the mobile device 22 communicate via carrier aggregation, which can be used to selectively increase bandwidth of the communication link. Carrier aggregation includes contiguous aggregation, in which contiguous carriers within the same operating frequency band are aggregated. Carrier aggregation can also be non-contiguous and can include carriers separated in frequency within a common band or in different bands.

In the example shown in FIG. 2A, the uplink channel includes three aggregated component carriers $f_{UL1}$, $f_{UL2}$, and $f_{UL3}$. Additionally, the downlink channel includes five aggregated component carriers $f_{DL1}$, $f_{DL2}$, $f_{DL3}$, $f_{DL4}$, and $f_{DL5}$. Although one example of component carrier aggregation is shown, more or fewer carriers can be aggregated for uplink and/or downlink. Moreover, a number of aggregated carriers can be varied over time to achieve desired uplink and downlink data rates.

For example, a number of aggregated carriers for uplink and/or downlink communications with respect to a particular mobile device can change over time. For example, the number of aggregated carriers can change as the device moves through the communication network and/or as network usage changes over time.

Figure 2B:
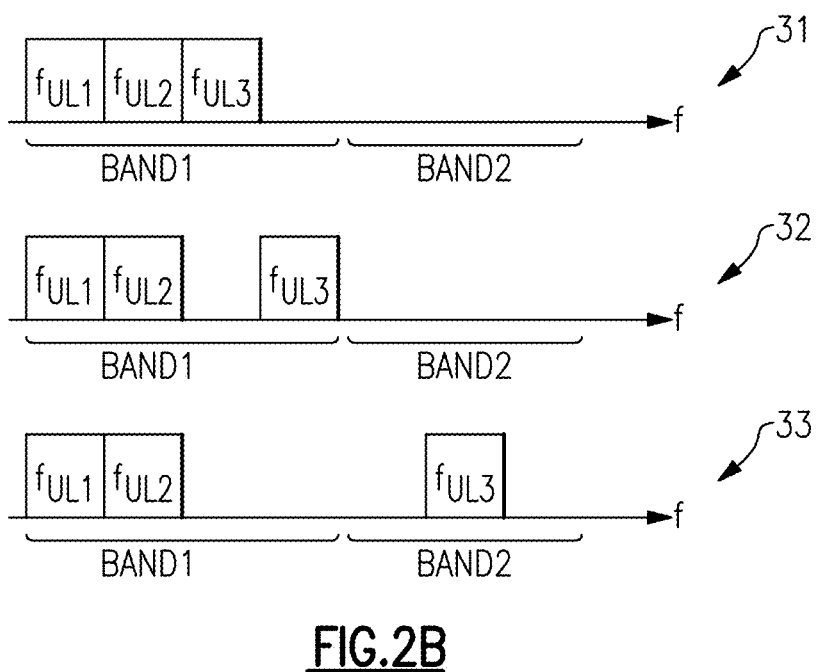
FIG. 2B illustrates various examples of uplink carrier aggregation for the communication link of FIG. 2A.

FIG. 2B illustrates various examples of uplink carrier aggregation for the communication link of FIG. 2A. FIG. 2B includes a first carrier aggregation scenario 31, a second carrier aggregation scenario 32, and a third carrier aggregation scenario 33, which schematically depict three types of carrier aggregation.

The carrier aggregation scenarios 31-33 illustrate different spectrum allocations for a first component carrier $f_{UL1}$, a second component carrier $f_{UL2}$, and a third component carrier $f_{UL3}$. Although FIG. 2B is illustrated in the context of aggregating three component carriers, carrier aggregation can be used to aggregate more or fewer carriers. Moreover, although illustrated in the context of uplink, the aggregation scenarios are also applicable to downlink.

The first carrier aggregation scenario 31 illustrates intra-band contiguous carrier aggregation, in which component carriers that are adjacent in frequency and in a common frequency band are aggregated. For example, the first carrier aggregation scenario 31 depicts aggregation of component carriers $f_{UL1}$, $f_{UL2}$, and $f_{UL3}$ that are contiguous and located within a first frequency band BAND1.

With continuing reference to FIG. 2B, the second carrier aggregation scenario 32 illustrates intra-band non-continuous carrier aggregation, in which two or more components carriers that are non-adjacent in frequency and within a common frequency band are aggregated. For example, the second carrier aggregation scenario 32 depicts aggregation of component carriers $f_{UL1}$, $f_{UL2}$, and $f_{UL3}$ that are non-contiguous, but located within a first frequency band BAND1.

The third carrier aggregation scenario 33 illustrates inter-band non-contiguous carrier aggregation, in which component carriers that are non-adjacent in frequency and in multiple frequency bands are aggregated. For example, the third carrier aggregation scenario 33 depicts aggregation of component carriers $f_{UL1}$ and $f_{UL2}$ of a first frequency band BAND1 with component carrier $f_{UL3}$ of a second frequency band BAND2.

Figure 2C:
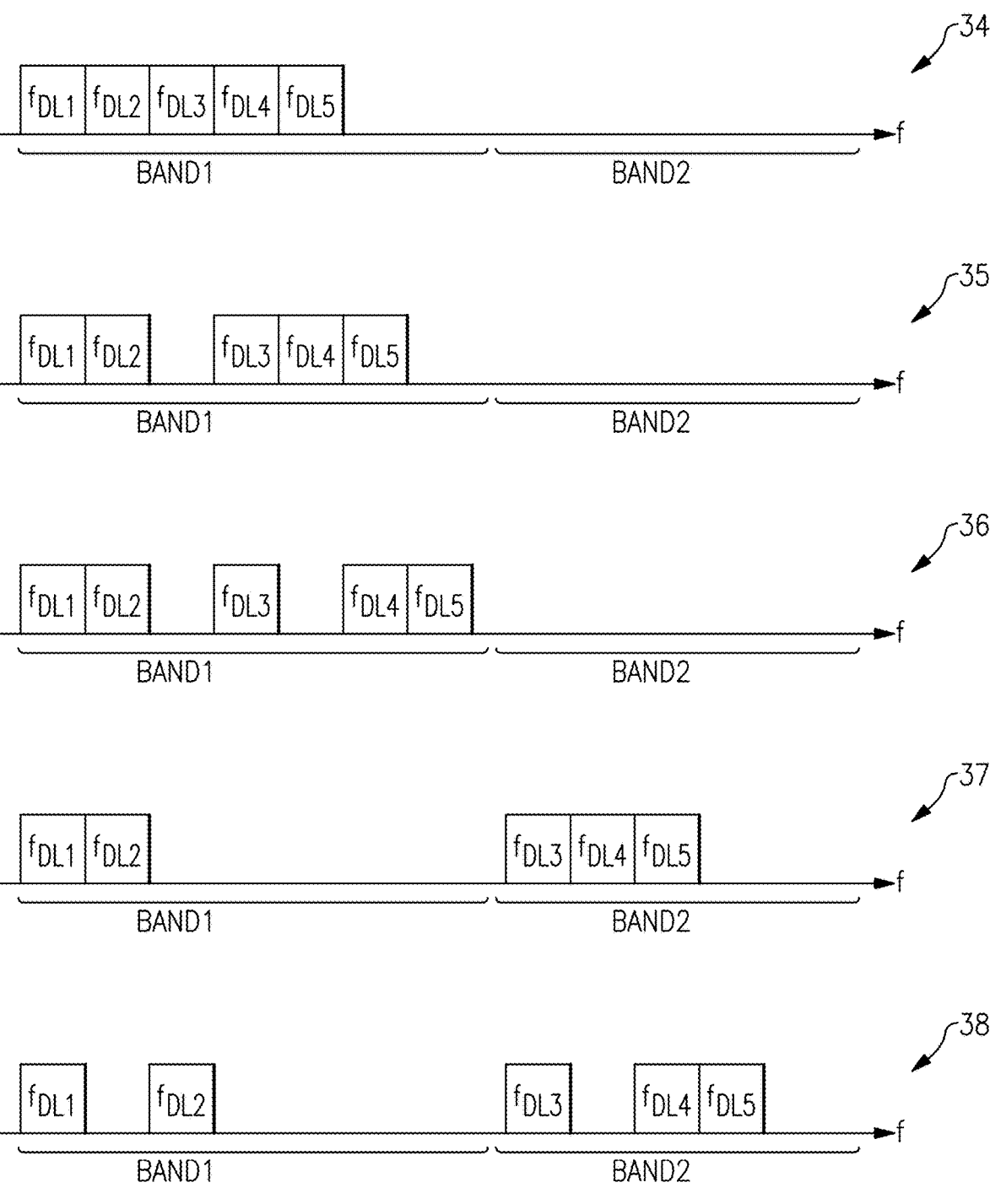
FIG. 2C illustrates various examples of downlink carrier aggregation for the communication link of FIG. 2A.

FIG. 2C illustrates various examples of downlink carrier aggregation for the communication link of FIG. 2A. The examples depict various carrier aggregation scenarios 34-38 for different spectrum allocations of a first component carrier $f_{UL1}$, a second component carrier $f_{DL2}$, a third component carrier $f_{DL3}$, a fourth component carrier $f_{DL4}$, and a fifth component carrier $f_{DL5}$. Although FIG. 2C is illustrated in the context of aggregating five component carriers, carrier aggregation can be used to aggregate more or fewer carriers. Moreover, although illustrated in the context of downlink, the aggregation scenarios are also applicable to uplink.

The first carrier aggregation scenario 34 depicts aggregation of component carriers that are contiguous and located within the same frequency band. Additionally, the second carrier aggregation scenario 35 and the third carrier aggregation scenario 36 illustrates two examples of aggregation that are non-contiguous, but located within the same frequency band. Furthermore, the fourth carrier aggregation scenario 37 and the fifth carrier aggregation scenario 38 illustrates two examples of aggregation in which component carriers that are non-adjacent in frequency and in multiple frequency bands are aggregated. As a number of aggregated component carriers increases, a complexity of possible carrier aggregation scenarios also increases.

With reference to FIGS. 2A-2C, the individual component carriers used in carrier aggregation can be of a variety of frequencies, including, for example, frequency carriers in the same band or in multiple bands. Additionally, carrier aggregation is applicable to implementations in which the individual component carriers are of about the same bandwidth as well as to implementations in which the individual component carriers have different bandwidths.

Certain communication networks allocate a particular user device with a primary component carrier (PCC) or anchor carrier for uplink and a PCC for downlink. Additionally, when the mobile device communicates using a single frequency carrier for uplink or downlink, the user device communicates using the PCC. To enhance bandwidth for uplink communications, the uplink PCC can be aggregated with one or more uplink secondary component carriers (SCCs). Additionally, to enhance bandwidth for downlink communications, the downlink PCC can be aggregated with one or more downlink SCCs.

In certain implementations, a communication network provides a network cell for each component carrier. Additionally, a primary cell can operate using a PCC, while a secondary cell can operate using a SCC. The primary and second cells may have different coverage areas, for instance, due to differences in frequencies of carriers and/or network environment.

License assisted access (LAA) refers to downlink carrier aggregation in which a licensed frequency carrier associated with a mobile operator is aggregated with a frequency carrier in unlicensed spectrum, such as WiFi. LAA employs a downlink PCC in the licensed spectrum that carries control and signaling information associated with the communication link, while unlicensed spectrum is aggregated for wider downlink bandwidth when available. LAA can operate with dynamic adjustment of secondary carriers to avoid WiFi users and/or to coexist with WiFi users. Enhanced license assisted access (eLAA) refers to an evolution of LAA that aggregates licensed and unlicensed spectrum for both downlink and uplink. Furthermore, NR-U can operate on top of LAA/eLAA over a 5 GHz band (5150 to 5925 MHz) and/or a 6 GHz band (5925 MHz to 7125 MHz).

Figure 3A:
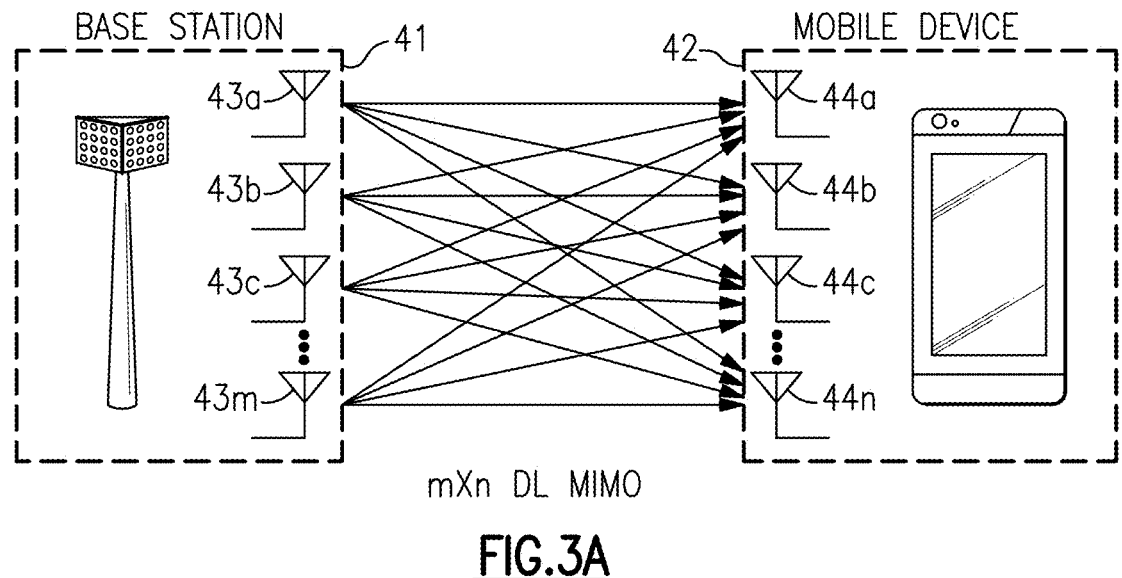
FIG. 3A is a schematic diagram of one example of a downlink channel using multi-input and multi-output (MIMO) communications.
Figure 3B:
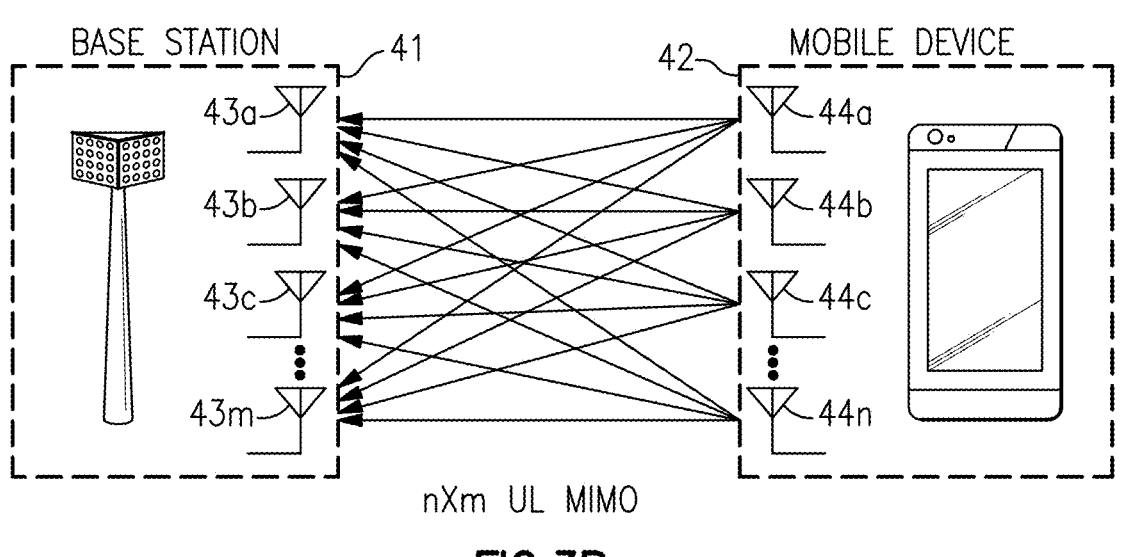
FIG. 3B is schematic diagram of one example of an uplink channel using MIMO communications.

FIG. 3A is a schematic diagram of one example of a downlink channel using multi-input and multi-output (MIMO) communications. FIG. 3B is schematic diagram of one example of an uplink channel using MIMO communications.

MIMO communications use multiple antennas for simultaneously communicating multiple data streams over common frequency spectrum. In certain implementations, the data streams operate with different reference signals to enhance data reception at the receiver. MIMO communications benefit from higher SNR, improved coding, and/or reduced signal interference due to spatial multiplexing differences of the radio environment.

MIMO order refers to a number of separate data streams sent or received. For instance, MIMO order for downlink communications can be described by a number of transmit antennas of a base station and a number of receive antennas for UE, such as a mobile device. For example, two-by-two (2×2) DL MIMO refers to MIMO downlink communications using two base station antennas and two UE antennas. Additionally, four-by-four (4×4) DL MIMO refers to MIMO downlink communications using four base station antennas and four UE antennas.

In the example shown in FIG. 3A, downlink MIMO communications are provided by transmitting using M antennas 43a, 43b, 43c, . . . 43m of the base station 41 and receiving using N antennas 44a, 44b, 44c, . . . 44n of the mobile device 42. Accordingly, FIG. 3A illustrates an example of m×n DL MIMO.

Likewise, MIMO order for uplink communications can be described by a number of transmit antennas of UE, such as a mobile device, and a number of receive antennas of a base station. For example, 2×2 UL MIMO refers to MIMO uplink communications using two UE antennas and two base station antennas. Additionally, 4×4 UL MIMO refers to MIMO uplink communications using four UE antennas and four base station antennas.

In the example shown in FIG. 3B, uplink MIMO communications are provided by transmitting using N antennas 44a, 44b, 44c, . . . 44n of the mobile device 42 and receiving using M antennas 43a, 43b, 43c, . . . 43m of the base station 41. Accordingly, FIG. 3B illustrates an example of n×m UL MIMO.

By increasing the level or order of MIMO, bandwidth of an uplink channel and/or a downlink channel can be increased.

MIMO communications are applicable to communication links of a variety of types, such as FDD communication links and TDD communication links.

Figure 3C:
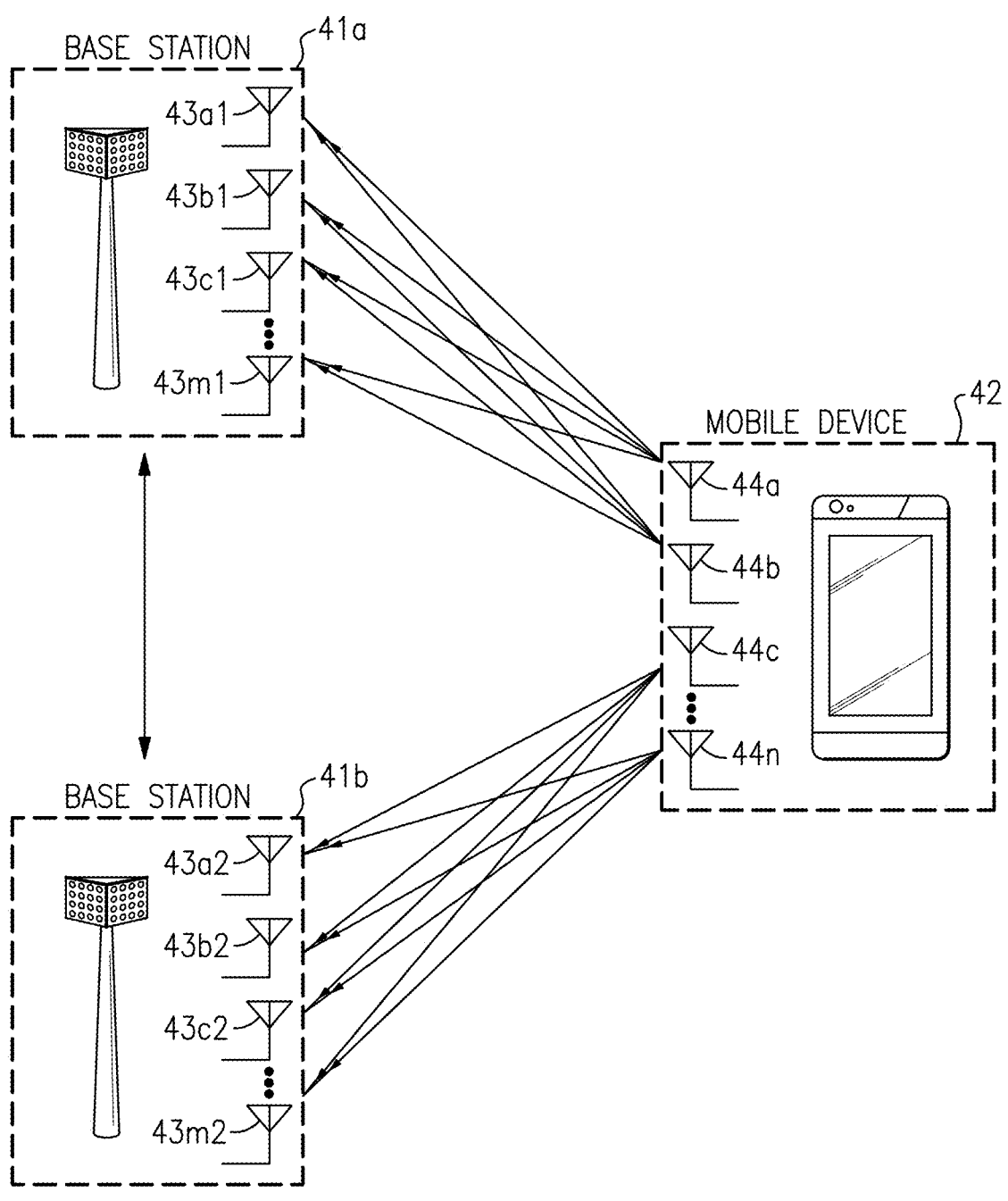
FIG. 3C is schematic diagram of another example of an uplink channel using MIMO communications.

FIG. 3C is schematic diagram of another example of an uplink channel using MIMO communications. In the example shown in FIG. 3C, uplink MIMO communications are provided by transmitting using N antennas 44a, 44b, 44c, . . . 44n of the mobile device 42. Additional a first portion of the uplink transmissions are received using M antennas 43a1, 43b1, 43c1, . . . 43m1 of a first base station 41a, while a second portion of the uplink transmissions are received using M antennas 43a2, 43b2, 43c2, . . . 43m2 of a second base station 41b. Additionally, the first base station 41a and the second base station 41b communication with one another over wired, optical, and/or wireless links.

The MIMO scenario of FIG. 3C illustrates an example in which multiple base stations cooperate to facilitate MIMO communications.

Figure 4:
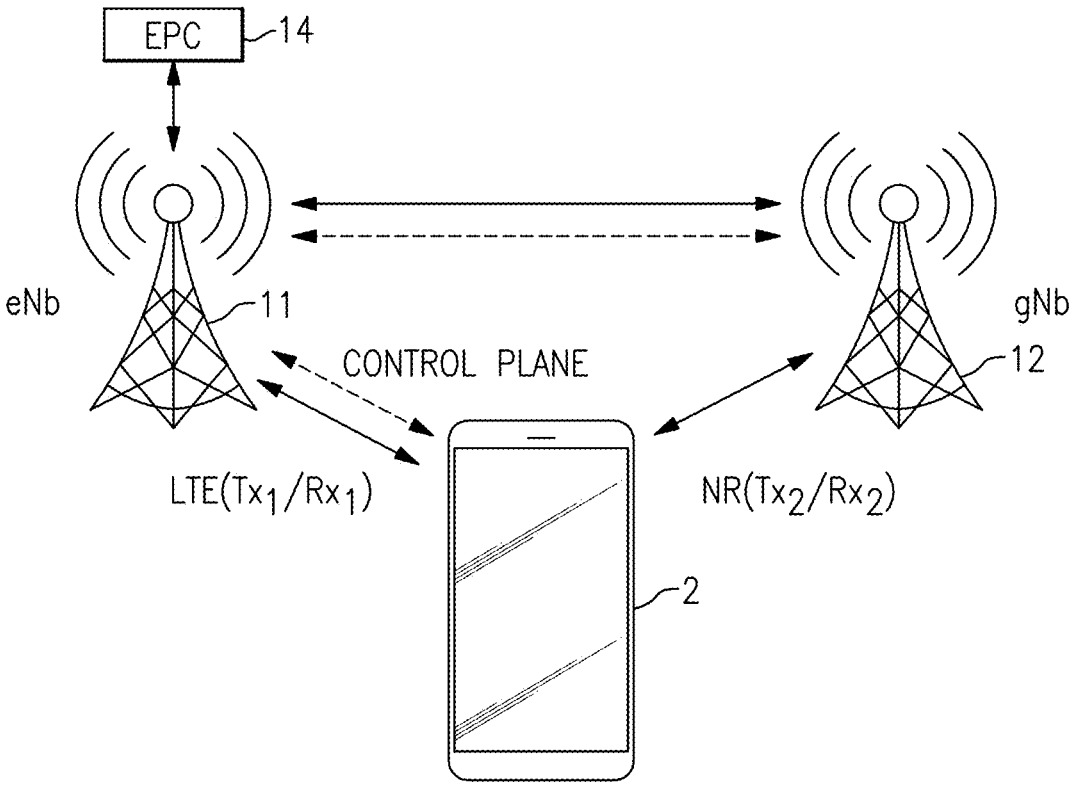
FIG. 4 is a schematic diagram of an example dual connectivity network topology.

FIG. 4 is a schematic diagram of an example dual connectivity network topology. This architecture can leverage LTE legacy coverage to ensure continuity of service delivery and the progressive rollout of 5G cells. A UE 2 can simultaneously transmit dual uplink LTE and NR carrier. The UE 2 can transmit an uplink LTE carrier Tx1 to the eNB 11 while transmitting an uplink NR carrier Tx2 to the gNB 12 to implement dual connectivity. Any suitable combination of uplink carriers Tx1, Tx2 and/or downlink carriers Rx1, Rx2 can be concurrently transmitted via wireless links in the example network topology of FIG. 1. The eNB 11 can provide a connection with a core network, such as an Evolved Packet Core (EPC) 14. The gNB 12 can communicate with the core network via the eNB 11. Control plane data can be wireless communicated between the UE 2 and eNB 11. The eNB 11 can also communicate control plane data with the gNB 12. Control plane data can propagate along the paths of the dashed lines in FIG. 4. The solid lines in FIG. 4 are for data plane paths.

In the example dual connectivity topology of FIG. 4, any suitable combinations of standardized bands and radio access technologies (e.g., FDD, TDD, SUL, SDL) can be wirelessly transmitted and received. This can present technical challenges related to having multiple separate radios and bands functioning in the UE 2. With a TDD LTE anchor point, network operation may be synchronous, in which case the operating modes can be constrained to Tx1/Tx2 and Rx1/Rx2, or asynchronous which can involve Tx1/Tx2, Tx1/Rx2, Rx1/Tx2, Rx1/Rx2. When the LTE anchor is a frequency division duplex (FDD) carrier, the TDD/FDD inter-band operation can involve simultaneous Tx1/Rx1/Tx2 and Tx1/Rx1/Rx2.

As discussed above, EN-DC can involve both 4G and 5G carriers being simultaneously transmitted from a UE. Transmitting both 4G and 5G carriers in a UE, such as a phone, typically involves two power amplifiers (PAs) being active at the same time. Traditionally, having two power amplifiers active simultaneously would involve the placement of one or more additional power amplifiers specifically suited for EN-DC operation. Additional board space and expense is incurred when designing to support such EN-DC/NSA operation.

Figure 5A:
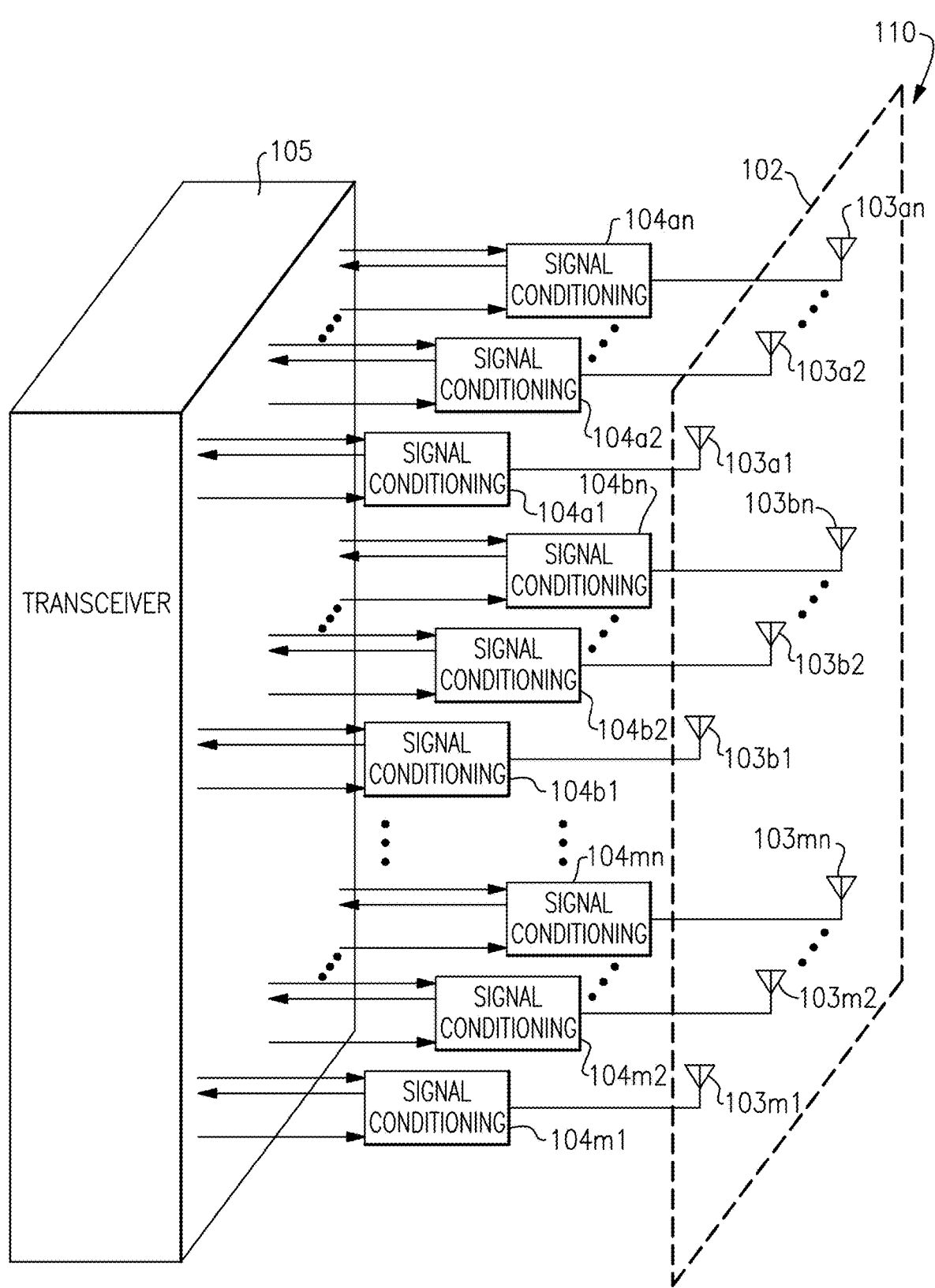
FIG. 5A is a schematic diagram of one example of a communication system that operates with beamforming.

FIG. 5A is a schematic diagram of one example of a communication system 110 that operates with beamforming. The communication system 110 includes a transceiver 105, signal conditioning circuits 104a1, 104a2 . . . 104an, 104b1, 104b2 . . . 104bn, 104m1, 104m2 . . . 104mn, and an antenna array 102 that includes antenna elements 103a1, 103a2 . . . 103an, 103b1, 103b2 . . . 103bn, 103m1, 103m2 . . . 103mn.

Communications systems that communicate using millimeter wave carriers (for instance, 30 GHz to 300 GHz), centimeter wave carriers (for instance, 3 GHz to 30 GHz), and/or other frequency carriers can employ an antenna array to provide beam formation and directivity for transmission and/or reception of signals.

For example, in the illustrated embodiment, the communication system 110 includes an array 102 of m×n antenna elements, which are each controlled by a separate signal conditioning circuit, in this embodiment. As indicated by the ellipses, the communication system 110 can be implemented with any suitable number of antenna elements and signal conditioning circuits.

With respect to signal transmission, the signal conditioning circuits can provide transmit signals to the antenna array 102 such that signals radiated from the antenna elements combine using constructive and destructive interference to generate an aggregate transmit signal exhibiting beam-like qualities with more signal strength propagating in a given direction away from the antenna array 102.

In the context of signal reception, the signal conditioning circuits process the received signals (for instance, by separately controlling received signal phases) such that more signal energy is received when the signal is arriving at the antenna array 102 from a particular direction. Accordingly, the communication system 110 also provides directivity for reception of signals.

The relative concentration of signal energy into a transmit beam or a receive beam can be enhanced by increasing the size of the array. For example, with more signal energy focused into a transmit beam, the signal is able to propagate for a longer range while providing sufficient signal level for RF communications. For instance, a signal with a large proportion of signal energy focused into the transmit beam can exhibit high effective isotropic radiated power (EIRP).

In the illustrated embodiment, the transceiver 105 provides transmit signals to the signal conditioning circuits and processes signals received from the signal conditioning circuits. As shown in FIG. 5A, the transceiver 105 generates control signals for the signal conditioning circuits. The control signals can be used for a variety of functions, such as controlling the gain and phase of transmitted and/or received signals to control beamforming.

Figure 5B:
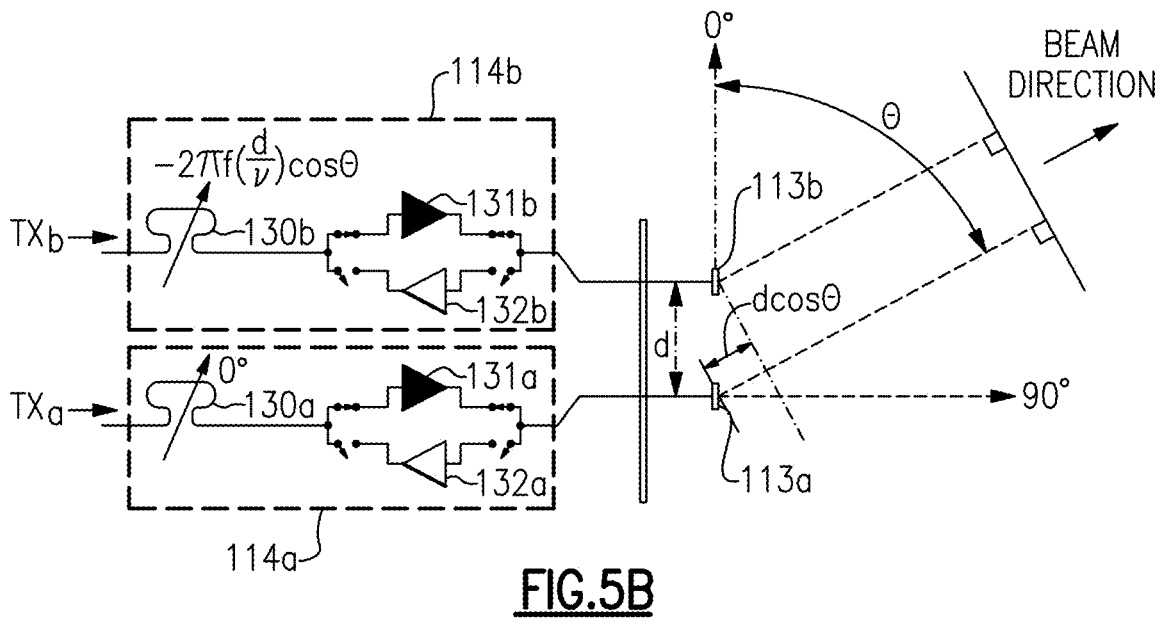
FIG. 5B is a schematic diagram of one example of beamforming to provide a transmit beam.

FIG. 5B is a schematic diagram of one example of beamforming to provide a transmit beam. FIG. 5B illustrates a portion of a communication system including a first signal conditioning circuit 114a, a second signal conditioning circuit 114b, a first antenna element 113a, and a second antenna element 113b.

Although illustrated as included two antenna elements and two signal conditioning circuits, a communication system can include additional antenna elements and/or signal conditioning circuits. For example, FIG. 5B illustrates one embodiment of a portion of the communication system 110 of FIG. 5A.

The first signal conditioning circuit 114a includes a first phase shifter 130a, a first power amplifier 131a, a first low noise amplifier (LNA) 132a, and switches for controlling selection of the power amplifier 131a or LNA 132a. Additionally, the second signal conditioning circuit 114b includes a second phase shifter 130b, a second power amplifier 131b, a second LNA 132b, and switches for controlling selection of the power amplifier 131b or LNA 132b.

Although one embodiment of signal conditioning circuits is shown, other implementations of signal conditioning circuits are possible. For instance, in one example, a signal conditioning circuit includes one or more band filters, duplexers, and/or other components.

In the illustrated embodiment, the first antenna element 113a and the second antenna element 113b are separated by a distance d. Additionally, FIG. 5B has been annotated with an angle $\theta$, which in this example has a value of about 90° when the transmit beam direction is substantially perpendicular to a plane of the antenna array and a value of about 0° when the transmit beam direction is substantially parallel to the plane of the antenna array.

By controlling the relative phase of the transmit signals provided to the antenna elements 113a, 113b, a desired transmit beam angle $\theta$ can be achieved. For example, when the first phase shifter 130a has a reference value of 0°, the second phase shifter 130b can be controlled to provide a phase shift of about $-2\pi f(d/v)\cos\theta$ radians, where f is the fundamental frequency of the transmit signal, d is the distance between the antenna elements, v is the velocity of the radiated wave, and $\pi$ is the mathematic constant pi.

In certain implementations, the distance d is implemented to be about ½ $\lambda$, where $\lambda$ is the wavelength of the fundamental component of the transmit signal. In such implementations, the second phase shifter 130b can be controlled to provide a phase shift of about $-\pi\cos\theta$ radians to achieve a transmit beam angle $\theta$.

Accordingly, the relative phase of the phase shifters 130a, 130b can be controlled to provide transmit beamforming. In certain implementations, a baseband processor and/or a transceiver (for example, the transceiver 105 of FIG. 5A) controls phase values of one or more phase shifters and gain values of one or more controllable amplifiers to control beamforming.

Figure 5C:
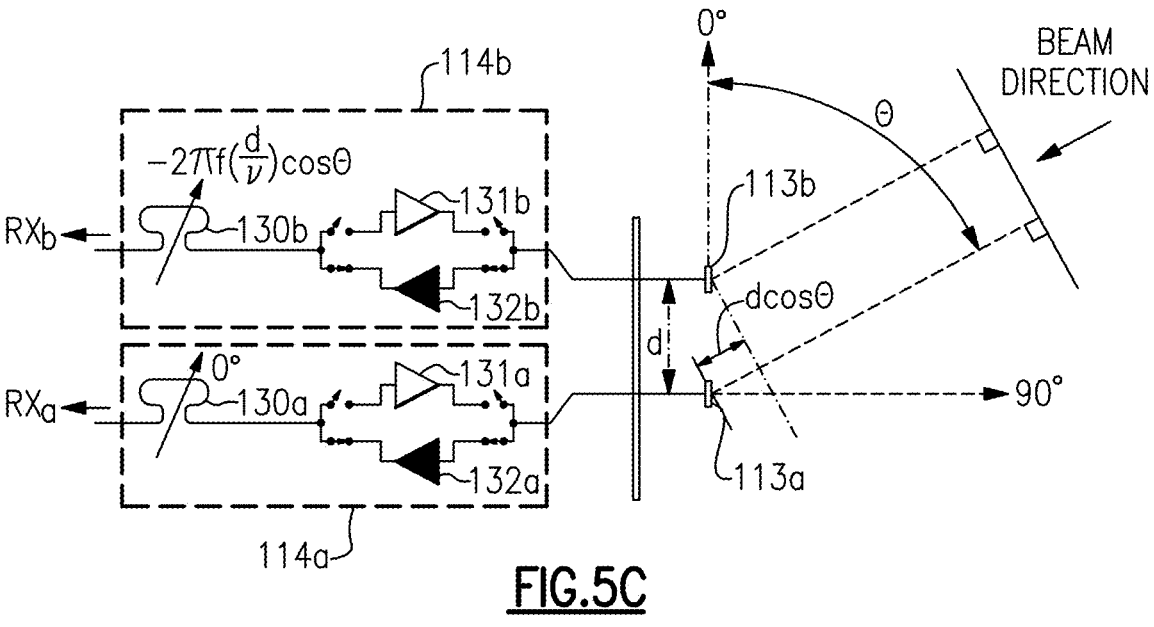
FIG. 5C is a schematic diagram of one example of beamforming to provide a receive beam.

FIG. 5C is a schematic diagram of one example of beamforming to provide a receive beam. FIG. 5C is similar to FIG. 5B, except that FIG. 5C illustrates beamforming in the context of a receive beam rather than a transmit beam.

As shown in FIG. 5C, a relative phase difference between the first phase shifter 130a and the second phase shifter 130b can be selected to about equal to $-2\pi f(d/v)\cos\theta$ radians to achieve a desired receive beam angle $\theta$. In implementations in which the distance d corresponds to about ½ $\lambda$, the phase difference can be selected to about equal to –π cos θ radians to achieve a receive beam angle θ.

Although various equations for phase values to provide beamforming have been provided, other phase selection values are possible, such as phase values selected based on implementation of an antenna array, implementation of signal conditioning circuits, and/or a radio environment.

In certain applications, such as modern RF front-end designs for 5G and 4G cellular communications, receiving a given frequency band can necessitate reception of multiple non-contiguous channel clusters (also referred to herein as component carriers). Such component carriers can share a single RF path in which the received RF signal is split in the RF front-end or in the transceiver using a different local oscillator (LO) applied to down-convert a particular modulation cluster. For example, a transceiver can internally split in many scenarios. However, in some cases, splitting in the RF front-end rather than the transceiver is desired due to limited LO isolation, the use of many component carriers concurrently, and/or in scenarios in which split RF signals are needed for separate transceiver ports or separate transceiver chips. For example, separate transceiver chips may be driven by independent radio access technology (RAT) reception of 4G and 5G or cellular and WiFi in shared unlicensed bands.

Typical schemes for splitting in an RF front-end suffer from a number of drawbacks. For example, a high isolation Wilkinson splitter following by a single-ended LNA can be used to split an RF receive signal into two split RF signals. However, such a splitting scheme suffers from challenging isolation limitations, large size, high loss, and/or difficult design considerations. For example, such splitting should not interfere with gain steps for receive automatic gain control (RxAGC), DC current limitations, and/or LNA linearity requirements.

Apparatus and methods for RF signal splitting are disclosed. In certain embodiments, a front-end system includes a filter that filters an RF receive signal to generate a differential filtered RF signal between a first output and a second output, a first LNA that generates a first amplified RF signal by amplifying a first component of the differential filtered RF signal received from the first output, a second LNA that generates a second amplified RF signal by amplifying a second component of the differential filtered RF signal received from the second output, a first multi-throw switch that receives the first amplified RF signal, and a second multi-throw switch that receives the second amplified RF signal.

By implementing the front-end system in this manner, RF signal splitting can be achieved while also realizing a number of advantages, such as improved gain performance, superior even-order linearity, and/or improved intermodulation performance, such as IMD2, IMD4, and/or IMD6 rejection. For example, the front-end system can provide common-mode rejection of components of transmit (Tx) leakage. Such improvement in common-mode rejection can lead to improved dynamic range, voltage handling capability, and/or linearization.

The first LNA and the second LNA amplify separate components of the differential filtered RF signal (a non-inverted or + component and an inverted or – component), and thus the first LNA and the second LNA collectively operate as a differential amplifier. The differential amplifier configuration mitigates the impacts of common-mode supply noise, ground bounce, and/or parasitic electromagnetic interference mechanisms. Such performance is particularly improved at higher frequencies, for example, a frequency range of 3.5 GHz to 7 GHz or beyond, which is the focus of many new 5G frequency bands.

Moreover, the first multi-throw switch and the second multi-throw switch allow for a connection from the outputs of two independent LNAs for high isolation performance. Furthermore, in certain implementations, the LNA power supply is provided on an output side of the multi-throw switch, for instance, allowing for open drain output of a common gate upper device in a cascode configuration of the LNAs. Thus, the output choke (supply inductor) and matching can be implemented on the output side of the multi-throw switches, significantly reducing the number of reactive components in comparison to a configuration using separate output matching networks.

In certain implementations, the filter is implemented as an acoustic wave filter having a single-ended input and a differential output. For instance, the acoustic filter can be a surface acoustic wave (SAW) filter or a temperature compensated surface acoustic wave (TC-SAW) filter.

The front-end system can further include a balun having a primary section connected between a first output of the first multi-throw switch and a first output of the second multi-throw switch, and a secondary section connected between a radio frequency receive signal terminal and ground. Thus, when signal splitting is not desired, a path through the balun can be used.

In certain implementations, a second output of the first multi-throw switch is connected to a first split RF signal terminal, and a second output of the second multi-throw switch is connected to a second split RF terminal. Thus, when signal splitting is desired, separate split RF signals can be provided from the first multi-throw switch and the second multi-throw switch.

Accordingly, the multi-throw switches are operable in a first mode in which the balun is used to generate a combined RF receive signal, and a second mode in which a first amplified RF signal is provided to the first split RF signal terminal and a second amplified RF signal is provided to the second split RF signal terminal. In the second mode, the first amplified RF signal and the second amplified RF signal can be provided to any suitable destination, such as separate ports of a transceiver or to separate transceivers.

Figure 6A:
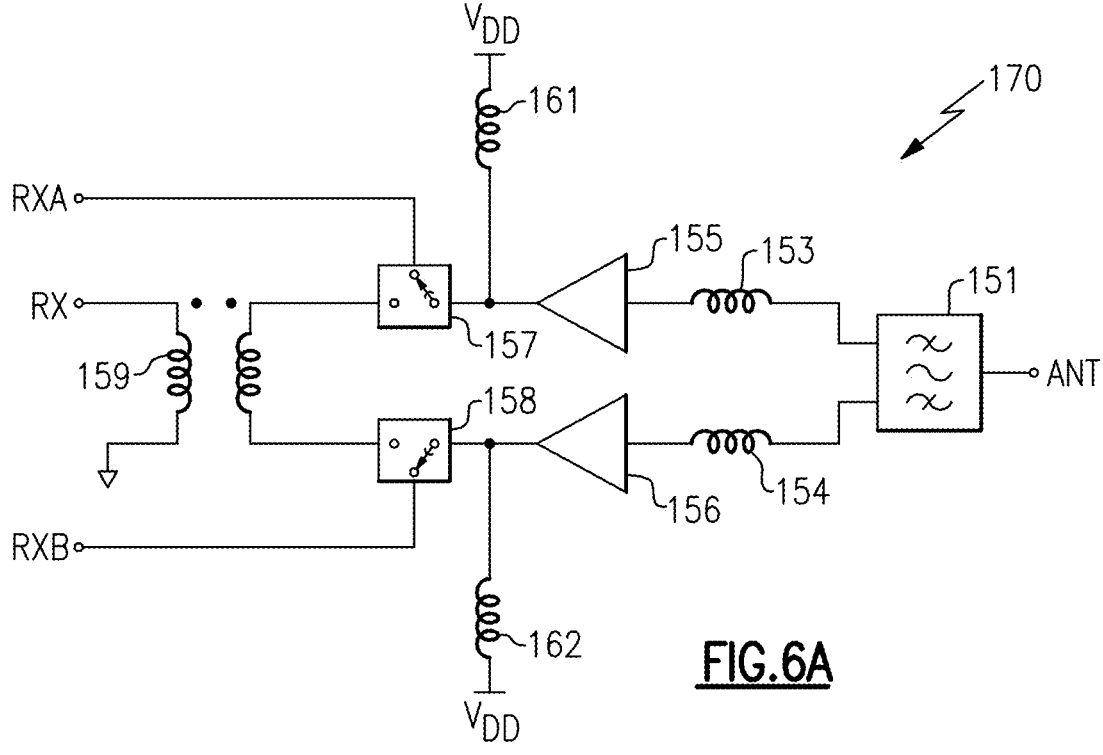
FIG. 6A is a schematic diagram of one embodiment of a front-end system.

FIG. 6A is a schematic diagram of one embodiment of a front-end system 170. The front-end system 170 includes a filter 151, a first input matching inductor 153, a second input matching inductor 154, a first LNA 155, a second LNA 156, a first supply inductor 161, a second supply inductor 162, a first multi-throw switch 157, a second multi-throw switch 158, and a balun 159.

The front-end system 170 receives an RF receive signal from an antenna terminal (ANT), which connects to an antenna either directly or indirectly through various components such as switches, antenna-plexers, and/or other structures.

The filter 151 receives the RF receive signal at an input, and outputs a differential filtered RF signal between a first output and a second output. In certain implementations, the filter 151 is a bandpass filter with a single-ended input and a differential output. For example, the filter 151 can be implemented as an acoustic filter, such as a SAW or TC-SAW filter.

As shown in FIG. 6A, the first LNA 155 receives a first component of the differential filtered RF signal from the first output of the filter 151 through the first input matching inductor 153. Additionally, the second LNA 156 receives a second component of the differential filtered RF signal from the second output of the filter 151 through the second input matching inductor 154. Furthermore, the first LNA 155 includes an output that provides a first amplified RF signal, and the second LNA 156 includes an output that provides a second amplified RF signal.

In the illustrated embodiment, the first supply inductor 161 is connected between the output of the first LNA 155 and a power amplifier supply voltage $V_{DD}$, and the second supply inductor 162 is connected between the output of the second LNA 156 and the power amplifier supply voltage $V_{DD}$.

With continuing reference to FIG. 6A, the first multi-throw switch 157 receives the first amplified RF signal from the first LNA 155, and the second multi-throw switch 158 receives the second amplified RF signal from the second LNA 156. Additionally, the balun 159 includes a primary section (also referred to as a first or primary winding) connected between a first output of the first multi-throw switch 157 and a first output of the second multi-throw switch 158, and a secondary section (also referred to as a second or secondary winding) connected between an RF receive signal terminal (RX) and a ground voltage. Furthermore, the first multi-throw switch 157 includes a second output connected to a first split RF signal terminal (RXA) and the second multi-throw switch 158 includes a second output connected to a second split RF signal terminal (RXB).

Accordingly, the first multi-throw switch 157 and the second multi-throw switch 158 are operable in a first mode in which the first amplified RF signal and the second amplified RF signal are provided to opposite ends of the primary section of the balun 159, and a second mode in which the first amplified RF signal is provided to the first split RF signal terminal (RXA) and the second amplified RF signal is provided to the second split RF signal terminal (RXB).

Figure 6B:
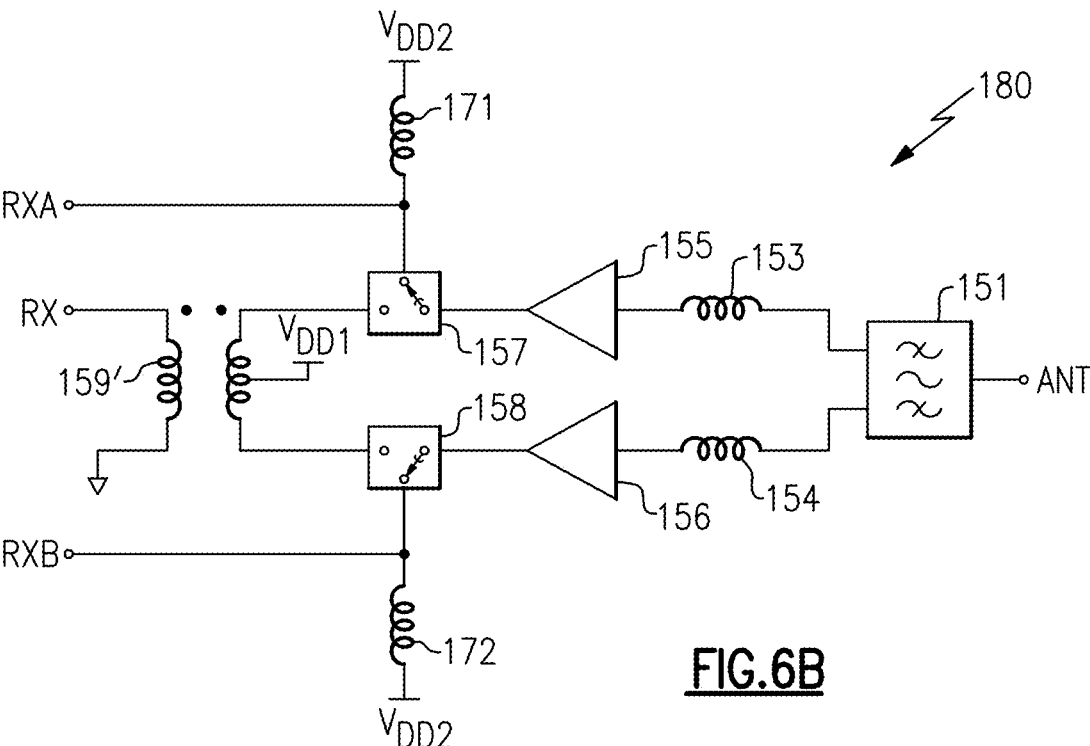
FIG. 6B is a schematic diagram of another embodiment of a front-end system.

FIG. 6B is a schematic diagram of another embodiment of a front-end system 180. The front-end system 180 includes a filter 151, a first input matching inductor 153, a second input matching inductor 154, a first LNA 155, a second LNA 156, a first supply inductor 171, a second supply inductor 172, a first multi-throw switch 157, a second multi-throw switch 158, and a balun 159'.

The front-end system 180 of FIG. 6B is similar to the front-end system 170 of FIG. 6A, except that the front-end system 180 includes a different implementation of powering the LNAs. In particular, the primary section of the balun 159' includes a center tap that receives a first power supply voltage $V_{DD1}$, which is used to power the first LNA 155 and the second LNA 156 when the first multi-throw switch 157 and the second multi-throw switch 158 operate in the first mode. Additionally, the first supply inductor 171 is connected between the second output of the first multi-throw switch 157 and a second power supply voltage $V_{DD2}$ and the second supply inductor 172 is connected between the second output of the second multi-throw switch 158 and the second power supply voltage $V_{DD2}$, which is used to power the first LNA 155 and the second LNA 156 when the first multi-throw switch 157 and the second multi-throw switch 158 operate in the second mode.

By implementing the front-end system 180 in this manner, separate power supply voltages (with different supply voltage levels as desired) can be used to enhance performance in the first mode and the second mode.

Furthermore, such a configuration allows the LNA power supply to be provided on an output side of the multi-throw switches, for instance, allowing for open drain output of a common gate upper device in a cascode configuration of the LNAs. Thus, the supply inductors and matching can be implemented on the output side of the multi-throw switches, significantly reducing the number of reactive components in comparison to a configuration using separate output matching networks.

Figures 6C, 6D:
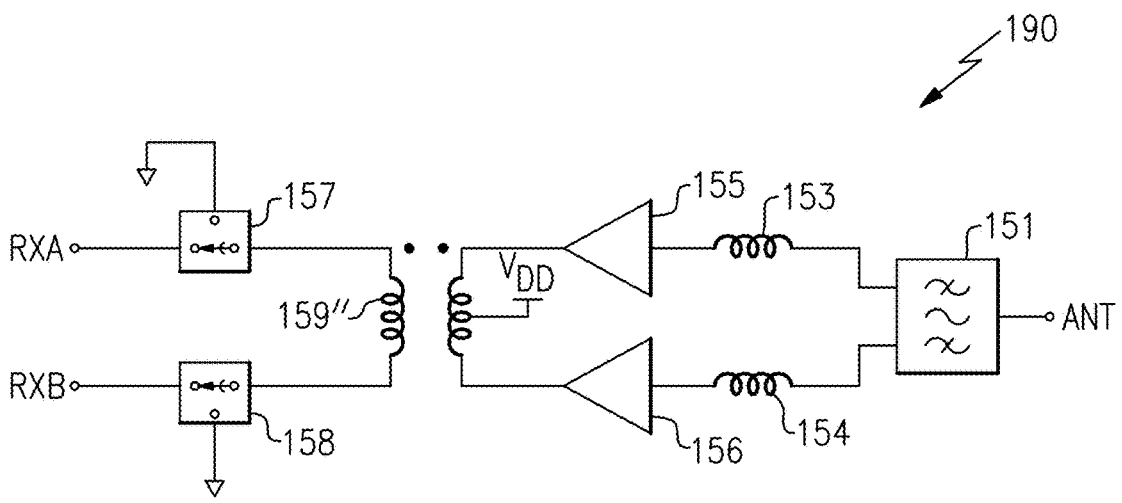
FIG. 6C is a schematic diagram of another embodiment of a front-end system.
FIG. 6D is a schematic diagram of another embodiment of a front-end system.

FIG. 6C is a schematic diagram of another embodiment of a front-end system 190. The front-end system 190 includes a filter 151, a first input matching inductor 153, a second input matching inductor 154, a first LNA 155, a second LNA 156, a first multi-throw switch 157, a second multi-throw switch 158, and a balun 159".

The front-end system 190 receives an RF receive signal from an antenna terminal (ANT), which connects to an antenna either directly or indirectly through various components such as switches, antenna-plexers, and/or other structures. The filter 151 receives the RF receive signal at an input, and outputs a differential filtered RF signal between a first output and a second output.

As shown in FIG. 6C, the first LNA 155 receives a first component of the differential filtered RF signal from the first output of the filter 151 through the first input matching inductor 153. Additionally, the second LNA 156 receives a second component of the differential filtered RF signal from the second output of the filter 151 through the second input matching inductor 154. Furthermore, the first LNA 155 includes an output that provides a first amplified RF signal, and the second LNA 156 includes an output that provides a second amplified RF signal.

In the illustrated embodiment, the balun 159" includes a primary section connected between the output of the first LNA 155 and the output of the second LNA 156. The primary section of the balun 159" includes a center tap that receives a power amplifier supply voltage $V_{DD}$ for powering the LNAs 155/156. The balun 159" further includes a secondary section including a first end connected to an input of the first multi-throw switch 157 and a second end connected to an input of the second multi-throw switch 158.

With continuing reference to FIG. 6C, the first multi-throw switch 157 receives the first amplified RF signal from the first LNA 155 through the balun 159", and the second multi-throw switch 158 receives the second amplified RF signal from the second LNA 156 through the balun 159". A first output of the first multi-throw switch 157 is connected to a first split RF signal terminal (RXA), while a first output of the second multi-throw switch 158 is connected to a second split RF signal terminal (RXB). A second output of the first multi-throw switch 157 and a second output of the second multi-throw switch 158 are connected to a ground voltage.

The first multi-throw switch 157 and the second multi-throw switch 158 are operable in three modes. In a first mode, the first amplified RF signal and the second amplified RF signal are provided to the first split RF signal terminal (RXA) and the second split RF signal terminal (RXB), thereby outputting a differential amplified receive signal between the RXA/RXB terminals.

In a second mode, the second multi-throw switch 158 is set to connect the input to the second output, thereby grounding the second end of secondary section of the balun 159". Additionally, in the second mode, the first multi-throw switch 157 is set to connect the input to the first output, thereby outputting the first amplified receive signal to the first split RF signal terminal (RXA).

In a third mode, the first multi-throw switch 157 is set to connect the input to the second output, thereby grounding the first end of secondary section of the balun 159". Additionally, in the third mode, the second multi-throw switch 158 is set to connect the input to the first output, thereby outputting the second amplified receive signal to the second split RF signal terminal (RXB).

FIG. 6D is a schematic diagram of another embodiment of a front-end system 195. The front-end system 195 includes a filter 151, a first input matching inductor 153, a second input matching inductor 154, a first LNA 155, a second LNA 156, first multi-throw switches 157a, 157b, . . . 157m, second multi-throw switches 158a, 158b, . . . 158m, and a balun 159'''.

The front-end system 195 of FIG. 6D is similar to the front-end system 190 of FIG. 6C, except that the front-end system 195 of FIG. 6D includes additional pairs multi-throw switches and split RF signal terminals for splitting for a factor m that is greater than or equal to 3. Additionally, the balun 159''' includes multiple (m) secondary sections or windings for coupling to each of the additional pairs of multi-throw switches.

For example, as shown in FIG. 6D, a first secondary section of the balun 159''' is connected between an input of the multi-throw switch 157a and an input of the multi-throw switch 158a. A first output of the multi-throw switch 157a is connected to the split RF signal terminal RXA, while a first output of the multi-throw switch 158a is connected to the split RF signal terminal RXB. Additionally, a second secondary section of the balun 159''' is connected between an input of the multi-throw switch 157b and an input of the multi-throw switch 158b. A first output of the multi-throw switch 157b is connected to the split RF signal terminal RXC, while a first output of the multi-throw switch 158b is connected to the split RF signal terminal RXD. Furthermore, a third (or more generally, mth) secondary section of the balun 159''' is connected between an input of the multi-throw switch 157m and an input of the multi-throw switch 158m. A first output of the multi-throw switch 157m is connected to the split RF signal terminal RXY, while a first output of the multi-throw switch 158m is connected to the split RF signal terminal RXZ.

In the illustrated embodiment, each of the first multi-throw switches 157a, 157b, . . . 157m and the second multi-throw switches 158a, 158b, . . . 158m includes a first output for connecting to a corresponding split RF signal terminal, and a second output for connected to ground. In certain implementations, each of the first multi-throw switches 157a, 157b, . . . 157m and the second multi-throw switches 158a, 158b, . . . 158m can also be set to an open state (OPEN) to facility unequal power combining and/or to eliminate the outputs from signal flow to avoid wasteful power losses.

The front-end system 195 of FIG. 6D is depicted in a configuration in which each of the first multi-throw switches 157a, 157b, . . . 157m and the second multi-throw switches 158a, 158b, . . . 158m are set to the first output, thereby generating three (or more generally m) pairs of differential output signals. In another mode, each of the first multi-throw switches 157a, 157b, . . . 157m are set to the first output while each of the second multi-throw switches 158a, 158b, . . . 158m are set to the second output, thereby generating three (or more generally m) single-ended output signals on terminal RXA, RXC, . . . RXY. In yet another mode, each of the first multi-throw switches 157a, 157b, . . . 157m are set to the second output while each of the second multi-throw switches 158a, 158b, . . . 158m are set to the first output, thereby generating three (or more generally m) single-ended output signals on terminal RXB, RXD, RXZ.

The multi-throw switches can also be set to deliver power to a selected output terminal or pair of output terminals. For example, the multi-throw switch 157a and the multi-throw switch 158a can be set to the first output while the remaining switches can be set to OPEN to provide a first output signal on terminal RXA and a second output signal on terminal RXB. Furthermore, using a similar configuration but with the multi-throw switch 158a set to ground (by way of the second output), an output signal can be provided on terminal RXA but not on terminal RXB. Likewise, using a similar configuration but with the multi-throw switch 157a set to ground (by way of the second output), an output signal can be provided on terminal RXB but not on RXA.

The front-end system 195 of FIG. 6D can also be used for equal power splitting of a subset of the output terminals. For example, the pair of switches of a given secondary section can be set to OPEN to disable that pair of output terminals. Additionally, the pair of switches of a given secondary section can both be set to the first output to enable that pair of output terminals. Furthermore, the pair of switches of a given secondary section can both set one switch of the pair to the first output and the second switch of the pair to the second output to enable a chosen one of the output terminals.

In a first example, equal power splitting between RXA, RXC, and RXY (Po/3 where Po is the output power) is provided by setting switch 157a to the first output (RXA), switch 158a to the second output (ground), switch 157b to the first output (RXB), switch 158b to the second output (ground), switch 157m to the first output (RXY), and switch 158m to the second output (ground).

In a second example, RXA is provided Po/2, RXC is provided Po/4, and RXD is provided Po/4 by setting switch 157a to the first output (RXA), switch 158a to the second output (ground), switch 157b to the first output (RXC), switch 158b to the first output (RXD), switch 157m to OPEN, and switch 158m to OPEN.

Thus, additional configurations splitting the power can be arbitrarily programmed without wasteful power loss. These flexible configurations can direct power to any output, and can split efficiently amongst an arbitrary combination of configured outputs, whether splitting equal power amplitudes, or intentionally unequal.

Figure 7A:
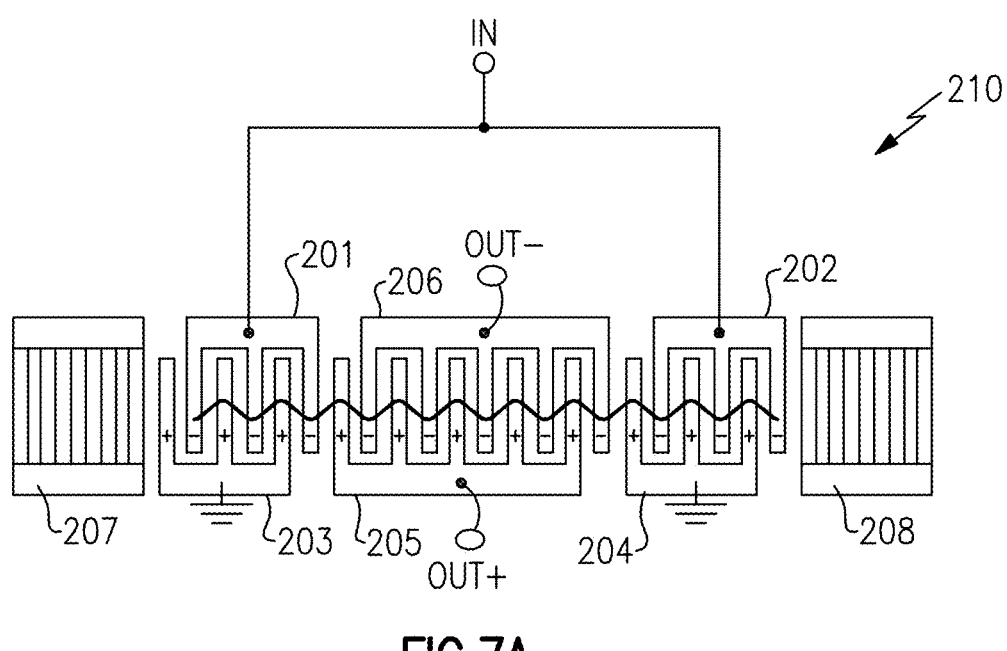
FIG. 7A is a schematic diagram of one embodiment of a filter with a single-ended input and a differential output.
Figure 7B:
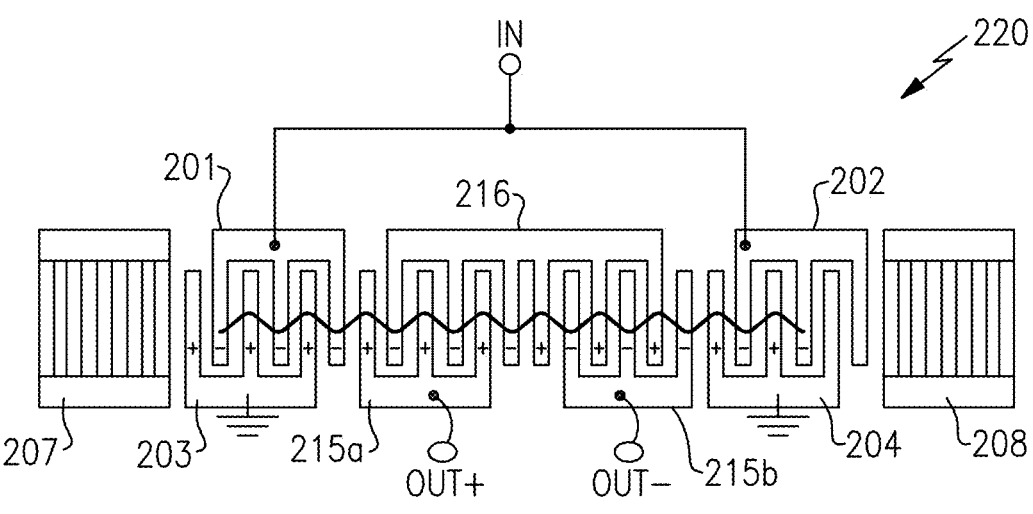
FIG. 7B is a schematic diagram of another embodiment of a filter with a single-ended input and a differential output.
Figure 7C:
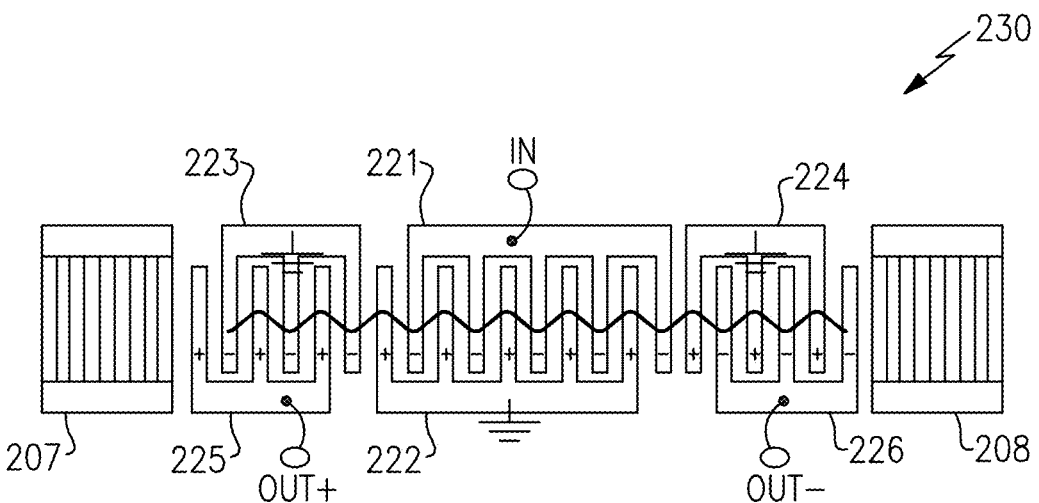
FIG. 7C is a schematic diagram of another embodiment of a filter with a single-ended input and a differential output.

FIGS. 7A to 7C are schematic diagrams of filters with a single-ended input and a differential output. The filters of FIGS. 7A to 7C are acoustic wave filters, such as SAW filters or TC-SAW filters. The filters of 7A to 7C can be used in any of the front-end systems herein to filter an RF receive signal to generate a differential filtered RF signal. Although three examples of filters are shown, the teachings herein are applicable to front-end systems using other implementations of filters.

FIG. 7A is a schematic diagram of one embodiment of a filter 210 with a single-ended input (IN) and a differential output (including a first output OUT+ and a second output OUT−). The filter 210 includes a first input transducer structure 201, a second input transducer structure 202, a first grounded transducer structure 203, a second grounded transducer structure 204, a first output transducer structure 205, a second output transducer structure 206, a first dummy transducer structure 207, and a second dummy transducer structure 208.

As shown in FIG. 7A, the first input transducer structure 201 includes a group of electrodes connected to the single-ended input (IN) and interdigitated with a group of electrodes of the first grounded transducer structure 203. Additionally, the second input transducer structure 202 includes a group of electrodes connected to the single-ended input (IN) and interdigitated with a group of electrodes of the second grounded transducer structure 204. The first output transducer structure 205 includes a group of electrodes connected to the first output (OUT+) and interdigitated with a group of electrodes of the second output transducer structure 206 that are connected to the second output (OUT−). The output transducer structures 205/206 are positioned between the input transducer structures 201/202, in this embodiment.

The dummy transducer structures 207/208 are included to aid in improving yield and enhancing manufacturability.

FIG. 7B is a schematic diagram of another embodiment of a filter 220 with a single-ended input (IN) and a differential output (OUT+/OUT−). The filter 220 includes a first input transducer structure 201, a second input transducer structure 202, a first grounded transducer structure 203, a second grounded transducer structure 204, a first output transducer structure 215a, a second output transducer structure 215b, an output reference transducer structure 216, a first dummy transducer structure 207, and a second dummy transducer structure 208.

The filter 220 of FIG. 7B is similar to the filter 210 of FIG. 7A, except that the filter 220 of FIG. 7B includes a different transducer implementation for the differential output. In particular, the first output transducer structure 215a includes a group of electrodes connected to the first output (OUT+) and interdigitated with a first group of electrodes of the output reference transducer structure 216, which in certain implementations can be grounded. Additionally, the second output transducer structure 215b includes a group of electrodes connected to the second output (OUT−) and interdigitated with a second group of electrodes of the output reference transducer structure 216. The output transducer structures 215a/215b are positioned between the input transducer structures 201/202, in this embodiment.

FIG. 7C is a schematic diagram of another embodiment of a filter 230 with a single-ended input (IN) and a differential output (OUT+/OUT−). The filter 230 includes an input transducer structure 221, a first grounded transducer structure 222, a second grounded transducer structure 223, a third grounded transducer structure 224, a first output transducer structure 225, a second output transducer structure 226, a first dummy transducer structure 207, and a second dummy transducer structure 208.

As shown in FIG. 7C, the input transducer structure 201 includes a group of electrodes connected to the single-ended input (IN) and interdigitated with a group of electrodes of the first grounded transducer structure 222. Additionally, the first output transducer structure 225 includes a group of electrodes connected to the first output (OUT+) and interdigitated with a group of electrodes of the second grounded transducer structure 223. Furthermore, the second output transducer structure 226 includes a group of electrodes connected to the second output (OUT−) and interdigitated with a group of electrodes of the third grounded transducer structure 224. The input transducer structure 221 is positioned between the output transducer structures 225/226, in this embodiment.

Figure 8:
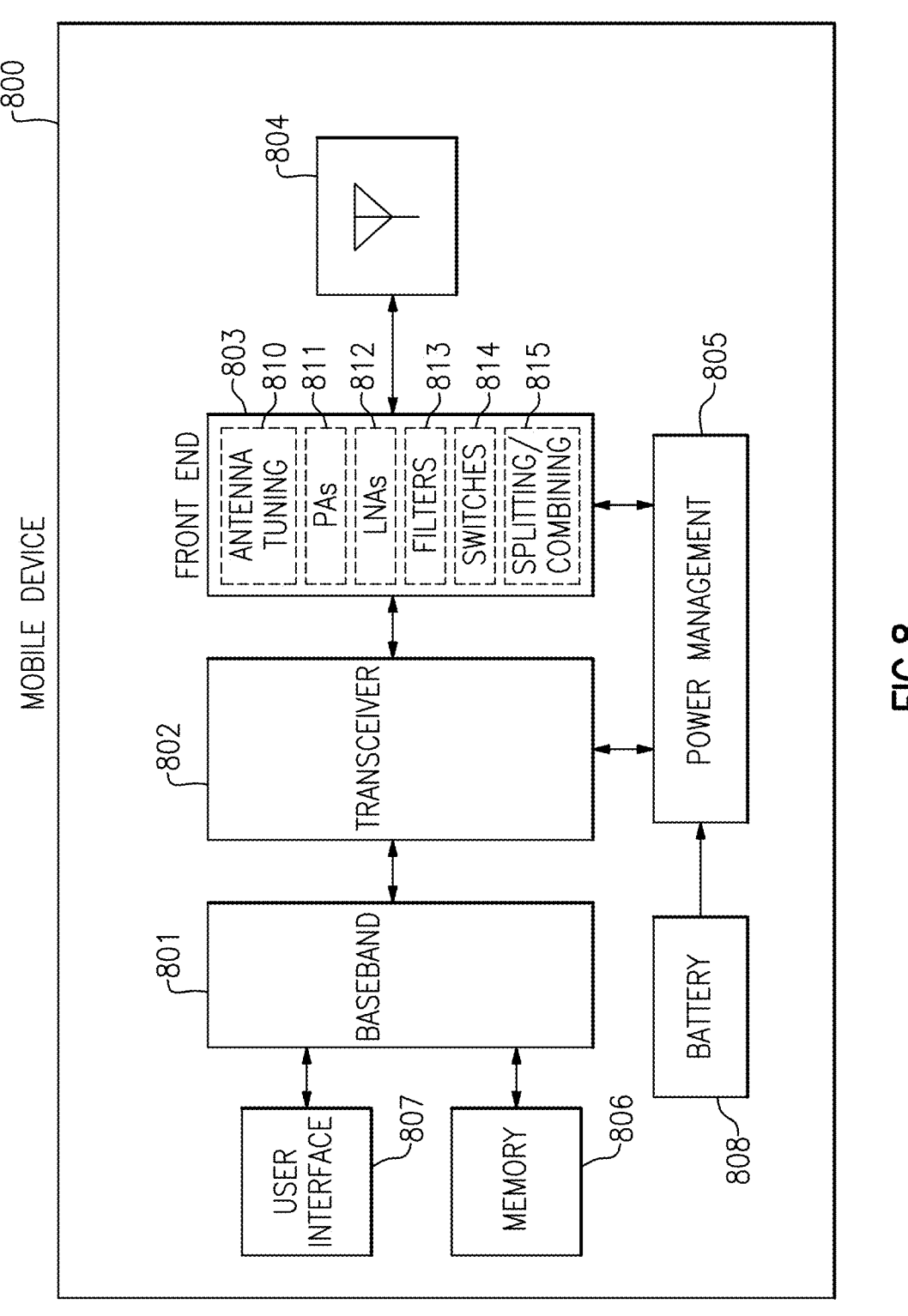
FIG. 8 is a schematic diagram of one embodiment of a mobile device.

FIG. 8 is a schematic diagram of one embodiment of a mobile device 800. The mobile device 800 includes a baseband system 801, a transceiver 802, a front-end system 803, antennas 804, a power management system 805, a memory 806, a user interface 807, and a battery 808.

The mobile device 800 can be used communicate using a wide variety of communications technologies, including, but not limited to, 2G, 3G, 4G (including LTE, LTE-Advanced, and LTE-Advanced Pro), 5G NR, WLAN (for instance, WiFi), WPAN (for instance, Bluetooth and ZigBee), WMAN (for instance, WiMax), and/or GPS technologies.

The transceiver 802 generates RF signals for transmission and processes incoming RF signals received from the antennas 804. It will be understood that various functionalities associated with the transmission and receiving of RF signals can be achieved by one or more components that are collectively represented in FIG. 8 as the transceiver 802. In one example, separate components (for instance, separate circuits or dies) can be provided for handling certain types of RF signals. Such separate transceiver circuits or dies can receive separate RF split signals from the front-end systems implemented in accordance with the teachings herein.

The front-end system 803 aids in conditioning signals transmitted to and/or received from the antennas 804. In the illustrated embodiment, the front-end system 803 includes antenna tuning circuitry 810, power amplifiers (PAs) 811, low noise amplifiers (LNAs) 812, filters 813, switches 814, and signal splitting/combining circuitry 815. The front-end system 803 can be implemented with signal splitting in accordance with any of the embodiments herein.

With continuing reference to FIG. 8, the front-end system 803 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 800 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 804 can include antennas used for a wide variety of types of communications. For example, the antennas 804 can include antennas for transmitting and/or receiving signals associated with a wide variety of frequencies and communications standards.

In certain implementations, the antennas 804 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 800 can operate with beamforming in certain implementations. For example, the front-end system 803 can include amplifiers having controllable gain and phase shifters having controllable phase to provide beam formation and directivity for transmission and/or reception of signals using the antennas 804. For example, in the context of signal transmission, the amplitude and phases of the transmit signals provided to the antennas 804 are controlled such that radiated signals from the antennas 804 combine using constructive and destructive interference to generate an aggregate transmit signal exhibiting beam-like qualities with more signal strength propagating in a given direction. In the context of signal reception, the amplitude and phases are controlled such that more signal energy is received when the signal is arriving to the antennas 804 from a particular direction. In certain implementations, the antennas 804 include one or more arrays of antenna elements to enhance beamforming.

The baseband system 801 is coupled to the user interface 807 to facilitate processing of various user input and output (I/O), such as voice and data. The baseband system 801 provides the transceiver 802 with digital representations of transmit signals, which the transceiver 802 processes to generate RF signals for transmission. The baseband system 801 also processes digital representations of received signals provided by the transceiver 802. As shown in FIG. 8, the baseband system 801 is coupled to the memory 806 of facilitate operation of the mobile device 800.

The memory 806 can be used for a wide variety of purposes, such as storing data and/or instructions to facilitate the operation of the mobile device 800 and/or to provide storage of user information.

The power management system 805 provides a number of power management functions of the mobile device 800. In certain implementations, the power management system 805 includes a PA supply control circuit that controls the supply voltages of the power amplifiers 811. For example, the power management system 805 can be configured to change the supply voltage(s) provided to one or more of the power amplifiers 811 to improve efficiency, such as power added efficiency (PAE).

As shown in FIG. 8, the power management system 805 receives a battery voltage from the battery 808. The battery 808 can be any suitable battery for use in the mobile device 800, including, for example, a lithium-ion battery.

Applications

Some of the embodiments described above have provided examples in connection with mobile devices. However, the principles and advantages of the embodiments can be used for a wide range of RF communication systems. Examples of such RF communication systems include, but are not limited to, mobile phones, tablets, base stations, network access points, customer-premises equipment (CPE), laptops, and wearable electronics.

Conclusion

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "may," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A mobile device comprising:

an antenna configured to receive a radio frequency receive signal; and a front-end system including a filter configured to filter the radio frequency receive signal to generate a differential filtered radio frequency signal between a first output and a second output, a first low noise amplifier configured to generate a first amplified radio frequency signal by amplifying a first component of the differential filtered radio frequency signal received from the first output, a second low noise amplifier configured to generate a second amplified radio frequency signal by amplifying a second component of the differential filtered radio frequency signal received from the second output, a first multi-throw switch having an input configured to receive the first amplified radio frequency signal, a second multi-throw switch having an input configured to receive the second amplified radio frequency signal, a balun including a primary section connected between a first output of the first multi-throw switch and a first output of the second multi-throw switch and having a center tap connected to a first power supply voltage, a first supply inductor connected between a second output of the first multi-throw switch and a second power supply voltage, and a second supply inductor connected between a second output of the second multi-throw switch and the second power supply voltage.

2. The mobile device of claim 1 wherein the balun further includes a secondary section connected between a radio frequency receive signal terminal and a ground voltage.

3. The mobile device of claim 2 wherein the second output of the first multi-throw switch is connected to a first split radio frequency signal terminal, and the second output of the second multi-throw switch is connected to a second split radio frequency signal terminal.

4. The mobile device of claim 3 wherein the first multi-throw switch and the second multi-throw switch are operable in a first mode in which the first amplified radio frequency signal and the second amplified radio frequency signal are provided to the primary section of the balun, and a second mode in which the first amplified radio frequency signal is provided to the first split radio frequency signal terminal and the second amplified radio frequency signal is provided to the second split radio frequency signal terminal.

5. The mobile device of claim 3 further comprising a transceiver configured to receive one or more radio frequency receive signals from the first split radio frequency signal terminal, the second split radio frequency signal terminal, and the radio frequency receive signal terminal.

6. The mobile device of claim 1 wherein the front-end system further includes a first matching inductor connected between an input of the first low noise amplifier and the first output of the filter, and a second matching inductor connected between an input of the second low noise amplifier and the second output of the filter.

7. The mobile device of claim 1 wherein the filter is an acoustic wave filter having a single-ended input and a differential output.

8. A method of radio frequency signal splitting in a mobile device, the method comprising:

filtering a radio frequency receive signal using a filter to generate a differential filtered radio frequency signal between a first output and a second output of the filter;

amplifying a first component of the differential filtered radio frequency signal received from the first output to generate a first amplified radio frequency signal;

amplifying a second component of the differential filtered radio frequency signal received from the second output to generate a second amplified radio frequency signal;

receiving the first amplified radio frequency signal as an input to a first multi-throw switch;

receiving the second amplified radio frequency signal as an input to a second multi-throw switch;

providing a first power supply voltage to a center tap of a primary section of a balun, the primary section connected between a first output of the first multi-throw switch and a first output of the second multi-throw switch; and providing a second power supply voltage to a first supply inductor and a second supply inductor, the first supply inductor connected between a second output of the first multi-throw switch and the second power supply voltage, and the second supply inductor connected between a second output of the second multi-throw switch and the second power supply voltage.

9. The method of claim 8 further comprising operating the first multi-throw switch and the second multi-throw switch in a first mode in which the first amplified radio frequency signal is provided to a first end of the primary section of the balun and the second amplified radio frequency signal is provided to a second end of the primary section of the balun.

10. The method of claim 9 further comprising outputting a single-ended radio frequency receive signal from a secondary section of the balun.

11. The method of claim 9 further comprising operating the first multi-throw switch and the second multi-throw switch in a second mode in which the first amplified radio frequency signal is provided from the second output of the first multi-throw switch to a first split radio frequency signal terminal and the second amplified radio frequency signal is provided from the second output of the second multi-throw switch to a second split radio frequency signal terminal.

12. The method of claim 8 further comprising providing matching using a first matching inductor connected between an input of the first low noise amplifier and the first output of the filter and using a second matching inductor connected between an input of the second low noise amplifier and the second output of the filter.

13. The method of claim 8 wherein the filter is an acoustic wave filter having a single-ended input and a differential output.

14. The method of claim 8 further comprising providing the radio frequency receive signal from an antenna to a single-ended input of the filter.

15. A front-end system comprising:

a filter configured to filter a radio frequency receive signal to generate a differential filtered radio frequency signal between a first output and a second output;

a first low noise amplifier configured to generate a first amplified radio frequency signal by amplifying a first component of the differential filtered radio frequency signal received from the first output;

a second low noise amplifier configured to generate a second amplified radio frequency signal by amplifying a second component of the differential filtered radio frequency signal received from the second output;

a first multi-throw switch having an input configured to receive the first amplified radio frequency signal;

a second multi-throw switch having an input configured to receive the second amplified radio frequency signal;

a balun including a primary section connected between a first output of the first multi-throw switch and a first output of the second multi-throw switch and having a center tap connected to a first power supply voltage; and a first supply inductor connected between a second output of the first multi-throw switch and a second power supply voltage, and a second supply inductor connected between a second output of the second multi-throw switch and the second power supply voltage.

16. The front-end system of claim 15 wherein the balun further includes a secondary section connected between a radio frequency receive signal terminal and a ground voltage.

17. The front-end system of claim 15 wherein the second output of the first multi-throw switch is connected to a first split radio frequency signal terminal, and the second output of the second multi-throw switch is connected to a second split radio frequency signal terminal.

18. The front-end system of claim 17 wherein the first multi-throw switch and the second multi-throw switch are operable in a first mode in which the first amplified radio frequency signal and the second amplified radio frequency signal are provided to the primary section of the balun, and a second mode in which the first amplified radio frequency signal is provided to the first split radio frequency signal terminal and the second amplified radio frequency signal is provided to the second split radio frequency signal terminal.

19. The front-end system of claim 15 further comprising a first matching inductor connected between an input of the first low noise amplifier and the first output of the filter, and a second matching inductor connected between an input of the second low noise amplifier and the second output of the filter.

20. The front-end system of claim 15 wherein the filter is an acoustic wave filter having a single-ended input and a differential output.

\* \* \* \* \*